United States Patent
Stern

(10) Patent No.: US 6,642,552 B2
(45) Date of Patent: Nov. 4, 2003

(54) INDUCTIVE STORAGE CAPACITOR

(75) Inventor: Donald S. Stern, San Jose, CA (US)

(73) Assignee: Grail Semiconductor, San Jose, CA (US)

( * ) Notice: Subject to any disclaimer, the term of this patent is extended or adjusted under 35 U.S.C. 154(b) by 58 days.

(21) Appl. No.: 09/776,003

(22) Filed: Feb. 2, 2001

(65) Prior Publication Data

US 2002/0145904 A1 Oct. 10, 2002

(51) Int. Cl.[7] .......................................... H07L 31/0382
(52) U.S. Cl. ........................ 257/195; 257/531; 257/281
(58) Field of Search ................................ 257/195, 531, 257/281, 664

(56) References Cited

U.S. PATENT DOCUMENTS

| | | | |
|---|---|---|---|
| 4,153,934 A | 5/1979 | Sato | 364/200 |
| 4,352,238 A | 10/1982 | Shimbo | 29/579 |
| 4,807,015 A | 2/1989 | Kobayashi et al. | 357/67 |
| 5,418,376 A | 5/1995 | Muraoka et al. | 257/136 |
| 5,442,211 A | 8/1995 | Kita | 257/301 |
| 5,600,166 A | 2/1997 | Clementi et al. | 257/324 |
| 5,607,773 A | 3/1997 | Ahlburn et al. | 428/427 |
| 5,756,385 A | 5/1998 | Yuan et al. | 438/258 |
| 5,834,992 A | 11/1998 | Kato et al. | 333/185 |
| 5,854,503 A | 12/1998 | Hsueh | 257/347 |
| 5,856,221 A | 1/1999 | Clementi | 438/258 |
| 6,004,847 A | 12/1999 | Clementi | 438/258 |
| 6,008,514 A | 12/1999 | Wu | 257/308 |
| 6,054,750 A | * 4/2000 | Imam et al. | 257/531 |
| 6,064,085 A | 5/2000 | Wu | 257/296 |
| 6,064,589 A | 5/2000 | Walker | 365/149 |
| 6,072,210 A | 6/2000 | Choi | 257/303 |
| 6,087,692 A | 7/2000 | Gobel et al. | 257/300 |
| 6,097,049 A | 8/2000 | Goebel et al. | 257/296 |
| 6,121,651 A | 9/2000 | Furukawa et al. | 257/296 |
| 6,137,131 A | 10/2000 | Wu | 257/309 |
| 6,143,617 A | 11/2000 | Shue et al. | 438/396 |
| 6,144,054 A | 11/2000 | Agahi et al. | 257/296 |

(List continued on next page.)

OTHER PUBLICATIONS www.ww.cooper.edu/courses/course_pages past_courses/ EE151/MEMS_Ho1/ –20k –Cached (in GOOGLE).*

(List continued on next page.)

Primary Examiner—Richard Elms
Assistant Examiner—Brad Smith
(74) Attorney, Agent, or Firm—Silicon Valley Patent Group LLP

(57) ABSTRACT

A device includes an element (e.g. in the shape of a sleeve) and a core located in an interior volume defined by the element and at least partially surrounded by the element. The element has two portions: one portion overlaps at least a region of the core thereby to form a capacitor, while another portion surrounds the core thereby to form an inductor. The device may further include an additional capacitor formed by another element that is separated from the core but overlaps at least a region of the core when viewed in a direction perpendicular to the core. The two elements substantially surround the core. The core may be used to hold charge in a non-volatile manner, even when no power is supplied to the device. The device can be manufactured in the normal manner, by forming a via hole, depositing a conductive layer in the via hole to form a sleeve-shaped element, forming a dielectric layer over the conductive layer so that the dielectric layer defines an interior volume, and filling the interior volume with a plug of conductive material that forms the core. An additional dielectric layer and an additional conductive layer may be formed to implement the additional capacitor.

18 Claims, 28 Drawing Sheets

U.S. PATENT DOCUMENTS

| | | | | |
|---|---|---|---|---|
| 6,147,376 | A | 11/2000 | Hofman et al. | 257/306 |
| 6,150,208 | A | 11/2000 | Deboer et al. | 438/240 |
| 6,157,565 | A | 12/2000 | Wu et al. | 365/175 |
| 6,249,039 | B1 * | 6/2001 | Harvey et al. | 257/531 |
| 6,272,003 | B1 | 8/2001 | Schaper | 361/306.2 |
| 6,346,741 | B1 * | 2/2002 | Van Buskirk et al. | 257/664 |
| 6,380,578 | B1 * | 4/2002 | Kunikiyo | 257/301 |
| 2002/0000556 | A1 | 1/2002 | Sakamoto et al. | 257/66 |

OTHER PUBLICATIONS

Book entitled "Nonvolatile Semiconductor Memory Technology", Edited by William D. Brown and Joe. E. Brewer and published by IEEE Press (1998), ISBN 0–7803–1173–6, pp. 310–313, and pp. 363–398.

Article entitled "Applied Materials Introduces New Storage Capacitor Solution for Gigabit DRAMs" dated Jul. 8, 1998 from Applied Material Corporation web site.

Article entitled "Feature–Rich Flash Memories Deliver High Density" by Dave Bursky, Electronic Design, dated Aug. 9, 1999, vol. 47, No. 16.

Book entitled "Flash Memories", Chapter 4 entitled "Physical Aspects of Cell operation and reliability" by Paolo Cappelletti et al. Kluwer Academic Publishers, 1999, pp. 157–160.

Book entitled "Fundamentals of Electronics", by E. Norman Lurch, John Wiley and Sons, Inc, Second Edition, 1971, Chapter 9 at page 236.

Book entitled "Flash Memories" by Paolo Cappelletti et al. Kluwer Academic Publishers, 1999, Chapter 6, pp. 363–375.

Book entitled "Semiconductor Memorie" by Askok K. Sharma, IEEE Presses, 1997, pp. 50–57.

Book entitled "Semiconductor Memories" by Betty Prince, Wiley Publishers, 1991, pp. 262–264.

Book entitled "CMOS Membory Circuits" by Tegze P. Haraszti, Kluwer Academic Publishers, 2000, pp. 105–109.

* cited by examiner

INDUCTIVE STORAGE CAPACITOR

BACKGROUND

A book entitled "Nonvolatile Semiconductor Memory Technology", Edited by William D. Brown and Joe. E. Brewer and published by IEEE Press (1998), ISBN 0-7803-1173-6, states, on page 1 "The ultimate solution—a genuine nonvolatile RAM that retains data without external power, can be read from or programmed like a static or dynamic RAM, and still achieve high-speed, high-density, and low power consumptions at an acceptable cost—remains unfeasible to this day." On page 6, this book describes a class of nonvolatile memory devices that store a charge on a conducting or semiconducting layer (called "floating gate") that is completely surrounded by dielectric and an opposing layer (called "control gate") that together form a capacitor (commonly known as "storage capacitor").

An article entitled "Applied Materials Introduces New Storage Capacitor Solution for Gigabit DRAMs" dated Jul. 8, 1998 describes use of tantalum pentoxide (Ta2O5) to form storage capacitors in memory devices. Such a storage capacitor cannot hold its charge over an extended period of time and loses a stored data bit unless its charge is refreshed periodically, as described at http://www.ee.cooper.edu/courses/course pages/past courses/EE151/MEMS HO1/. As described therein, the periodic refreshing requires additional memory circuitry and complicates the operation of dynamic random access memory (DRAM) formed from such capacitors.

The above-described periodic refreshing can be avoided by flash memory. There are several kinds of flash memory, including a single-transistor cell and a two-transistor cell as described in an article in Electronic Design, dated Aug. 9, 1999, and entitled "Feature-Rich Flash Memories Deliver High Density" by Dave Bursky. As described therein, a single-transistor cell is employed in a NOR-like logic structure to form a random-access storage array (called "flash EPROM"). Moreover, the two-transistor (or a merged transistor, dual-gate) cell is also a NOR-style configuration (called "flash EEPROM"). On-chip decoding circuits divide an array of two-transistor cells into small blocks (256 bytes to 4 kbytes) that normally enable a smaller portion of the chip to be erased and reprogrammed.

Several issues exist with the flash memory as described in the above-identified book by Brown and Brewer, such as slow trapping, polarization, oxide breakdown/leakage, hot-electron injection, and oxide-hopping conduction, as described in Table 6.2 on page 362

SUMMARY

In accordance with the invention, a semiconductor substrate has formed therein an inductor and a capacitor integrated into a single device (called an "inductive capacitor"). The inductor causes the capacitor to charge faster than the charging of a prior art device that has significant capacitance but negligible inductance (e.g. a device in which the capacitive contribution to the resonant frequency (of an LC circuit formed by such a prior art device) is greater than 90% of the inductive contribution). The device can include any structure that implements the inductive and capacitive functions in an integrated manner. Such a device having a significant inductive effect can be used in any radio-frequency (RF) circuit.

In one embodiment, the device includes a rod-shaped second element (hereinafter simply "plug") that is located in an interior space defined by a sleeve-shaped first element (hereinafter simply "sleeve"), thereby to form a capacitor (also called "first capacitor") and an inductor in the same device. The core is separated from the sleeve by a dielectric material (also called "trap material") that stores an electrical charge when the device is powered off (such as silicon—silicon dioxide interface). An inductive capacitor that includes a trap material between the two elements is also referred to as an "inductive storage capacitor." Such an inductive storage capacitor is used to implement a nonvolatile memory cell in one application, and a timing circuit in another application.

DETAILED DESCRIPTION

A semiconductor substrate 1 (FIG. 1) in one embodiment has formed therein a device 2 including a first element 3 of a conductive material that surrounds a second element 4 that may be of the same or different conductive material. Depending on the aspect ratio, the second element 4 can be in the shape of a coin (that has a height significantly smaller than the diameter, e.g. an order of magnitude smaller), or a needle (that has a height significantly larger than the diameter, e.g. an order of magnitude larger), or a rod (which has an aspect ratio somewhere between a coin and a needle).

Figure 1:
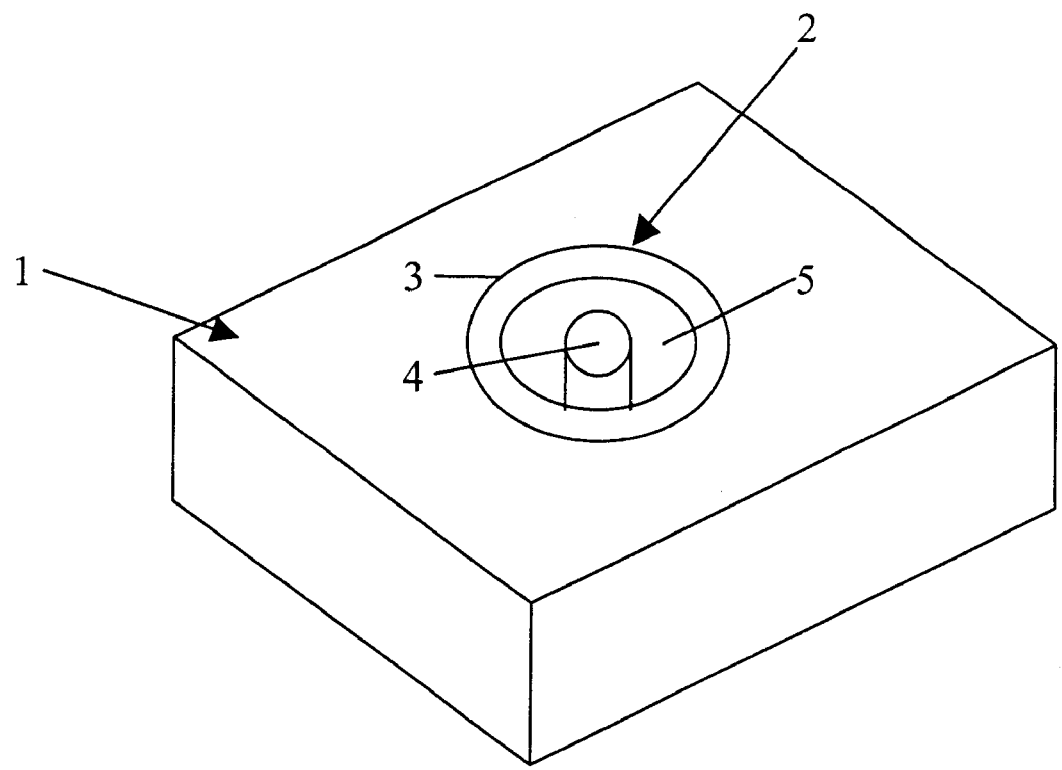
FIG. 1 illustrates in integrated circuit die containing an inductive capacitor in one embodiment of the invention.

As would be apparent to the skilled artisan, a ring-shaped first element 3 surrounding a coin-shaped second element 4 has a negligible capacitive effect and significant inductive effect (e.g. the capacitive contribution to the resonant frequency (of an LC circuit formed by such a device) is less than 10% of the inductive contribution). Such a device 2 having a significant inductive effect can be used in any radio-frequency (RF) circuit. Another device 2 having significant inductive as well as capacitive effects can be used as a storage capacitor for nonvolatile memory, as described herein. Although a specific structure is illustrated in FIG. 1, device 2 can include any structure that implements the inductive and capacitive functions in an integrated manner.

Figure 2:
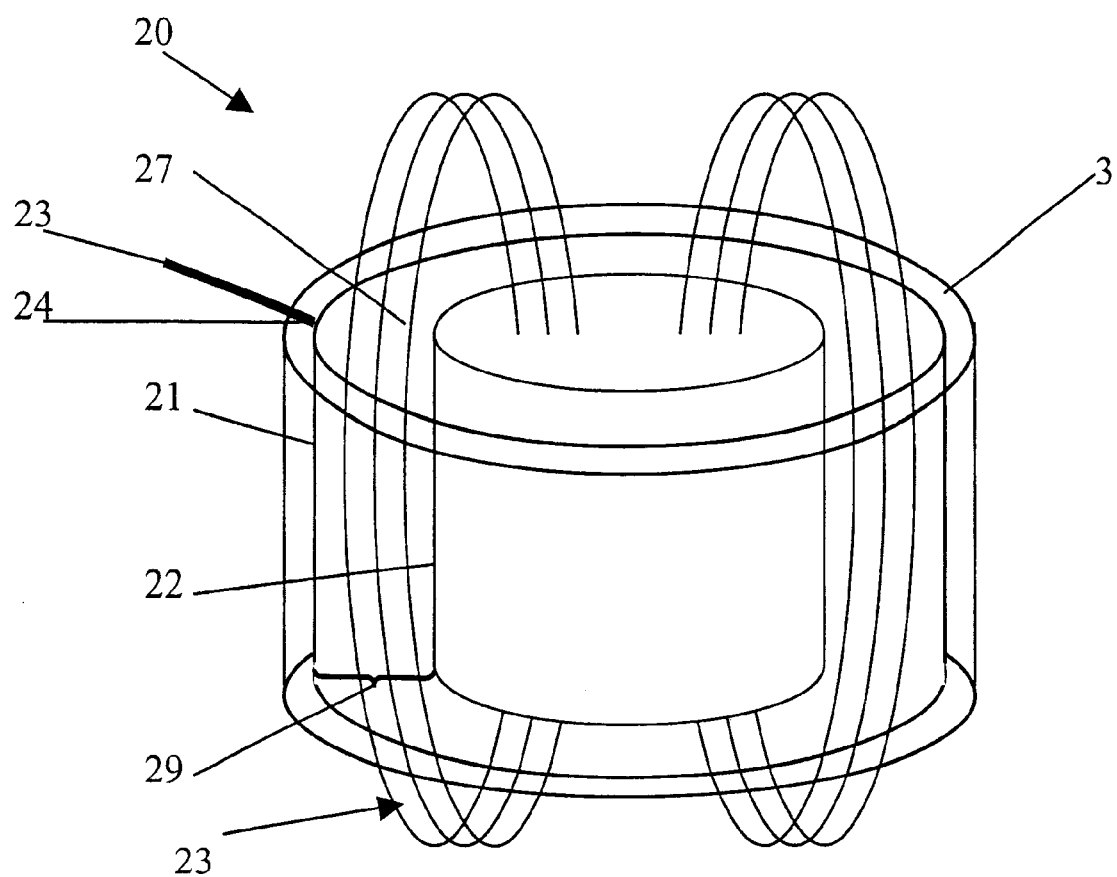
FIG. 2 illustrates flux lines induced in the inductive capacitor of FIG. 1 during operation.

In one embodiment, the device 2 includes a rod-shaped second element 4 (hereinafter simply "plug") that is located in an interior space defined by a sleeve-shaped first element 3 (hereinafter simply "sleeve"), thereby to form a capacitor (also called "first capacitor") and an inductor in the same device. A trace (not shown in FIG. 1) is attached to an input terminal 24 (FIG. 2) located at one end of sleeve 3, to provide current and voltage for operation of the device. As described below, the inductor causes the capacitor to charge faster than the charging of a prior art device that has significant capacitance but negligible inductance (e.g. the capacitive contribution to the resonant frequency (of an LC circuit formed by such a prior art device) is greater than 90% of the inductive contribution).

Plug 4 is separated from sleeve 3 by any dielectric material, including, for example a material 5 (also called "trap material") that stores an electrical charge when device 2 is powered off (such as either silicon—silicon dioxide interface, or silicon—silicon nitride interface). An inductive capacitor that includes a trap material 5 between sleeve 3 and plug 4 is also referred to as an "inductive storage capacitor."

Sleeve 3 can have any cross-section, such as circular, rectangular, triangular, etc. Moreover, the sleeve need not be continuous in the cross-sectional view (e.g. such a sleeve may have a cross-section in the shape of the letter "C" of the English alphabet). One end of sleeve 3 is coupled to a voltage source, so that during operation electrons flow into the device from this end of the sleeve towards the other end, thereby to form an inductor (device in which an electromotive force is induced in it or in a nearby circuit by a change of current in either itself or the nearby circuit). Plug 4 can also have any cross-section, which may or may not be solid, depending on the embodiment.

During operation, an inductive field 23 (FIG. 2) is generated between an inner surface 21 of sleeve 3 (which acts as a coil) and a surface 22 of plug 4 (which acts as a core). Surfaces 21 and 22 together form a capacitor 29. Inductive field 23 is used to store a charge in trap material 27 that is located between surfaces 21 and 22. As capacitor 29 charges, inductive field 23 is formed, and causes electron wave movement (a well known phenomenon in physics, as described in Chapter 4 entitled "Physical Aspects of Cell operation and reliability" in the book entitled "Flash Memories" by Paolo Cappelletti et al. Kluwer Academic Publishers, 1999, which chapter is incorporated by reference herein in its entirety) or tunneling to occur through trap material 27 (e.g. along the silicon—silicon dioxide interface).

As capacitor 29 (also called "storage capacitor") reaches the level of the voltage supply, inductive field 23 collapses causing free electrons to be trapped in the silicon—silicon dioxide interface. Therefore, 'trap to band tunneling' (well known in the art) is performed by creation and collapse of inductive field 23. The process is reversed when storage capacitor 29 is discharged, and the inductive field 23 is reversed causing the trapped electrons to be removed. Such an inductive storage capacitor 20 is of a different design than a storage capacitor in conventional non-volatile solid state memory devices known to applicant, and uses a new method for programming and reading the levels of the electrons that are stored in the device.

Inductive storage capacitor 20 (FIG. 2) forms an electrical circuit 30 (FIG. 3) that in turn can be implemented in other structures apparent to the skilled artisan in view of the disclosure. Circuit 30 includes a capacitor 33, an inductor 34 coupled in parallel to capacitor 33, and a trap material 37 located inside capacitor 33. In one embodiment, inductor 34 is in contact with trap material 37. However, inductor 34 need not be in contact with, e.g. can be simply adjacent to trap material 37 (if there is another material located therebetween).

Figure 3:
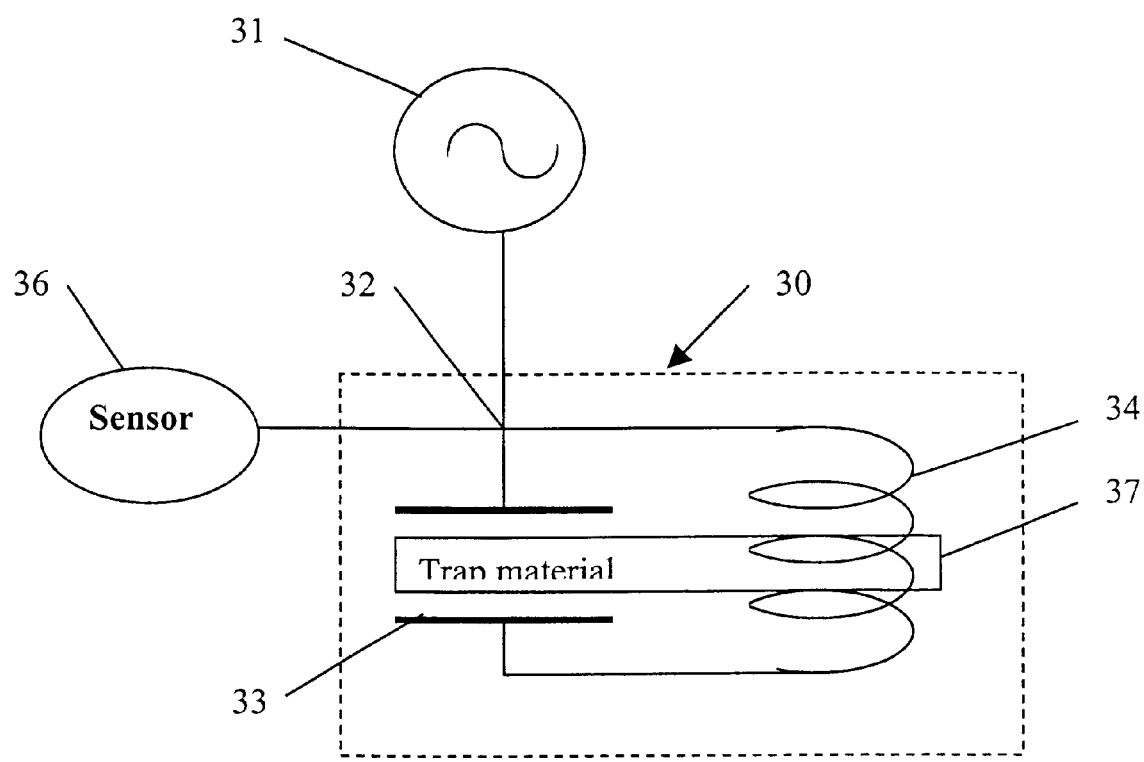
FIGS. 3 and 5 illustrate, in circuit diagrams, the inductive capacitor of FIG. 1 filled with a trap material, and coupled to a voltage source and a sensor, in two embodiments.

Regardless of the relative locations of inductor 34 and trap material 37, during operation of circuit 30, inductor 34 generates a field (e.g. similar or identical to field 23 discussed above in reference to FIG. 2) passing through trap material 37. In this embodiment, a sensor 36 is coupled to capacitor 33, to sense a charge stored in the traps of trap material 37. In one implementation, capacitor 33, inductor 34, sensor 36 and voltage source 31 are all coupled to a common terminal 32 as illustrated in FIG. 3 although in other embodiments, other such couplings may be made.

In one embodiment, an inductive storage capacitor 20 (FIG. 4) is located adjacent to an element 45 to form a device 40 wherein a surface 46 of element 45 and a surface 44 of plug 4 form a capacitor (called "sense capacitor") 48. Sensing capacitor 48 is separate and distinct from (but coupled in series to) the above-discussed capacitor 29 (FIGS. 2 and 4) in inductive storage capacitor 20. As trap material 27 becomes filled with electrons, a surface 44 of plug 4 collects an opposite (i.e. negative) charge and the voltage level of adjacent element 45 (or sensing capacitor) is changed. The voltage level (on sensing capacitor 48) and current flow (through sensing capacitor 48) is used to detect the current state of the storage capacitor.

Device 40 (FIG. 4) forms an electrical circuit 50 (FIG. 5) that can also be implemented in other structures apparent to the skilled artisan in view of the disclosure. Circuit 50 is similar or identical to circuit 30 described above except for the following differences. Circuit 50 includes an additional capacitor 55 (also called "sense capacitor") in series with capacitor 33 (also called "storage capacitor" and described above in reference to FIG. 3). Note that inductor 34 is coupled in parallel to storage capacitor 33 (and in series with sense capacitor 55). Circuit 50 also includes a sensor 56 that is coupled to a terminal of sensor capacitor 55. Although there is no sensor coupled to storage capacitor 33 in this embodiment, a voltage source 31 is coupled to a terminal 32 (of capacitor 33) that in turn is coupled to inductor 34. Note that trap material 37 is not present inside sense capacitor 55, instead a dielectric material may be present.

When voltage source 31 (FIG. 5) is coupled to terminal 32 the voltage potential causes current to charge storage capacitor 33 and in parallel induce an inductive field in the inductor 34. As voltage source 31 is applied current flows from storage capacitor 33 to sense capacitor 55 causing sense capacitor 55 to charge. The delay in charging sense capacitor 55 is measured by connecting sense capacitor 55 to a sensor 56 to measure the voltage or current on the output of sense capacitor 55. Such delay is different, depending at least on whether or not trap material 37 holds a charge therein. Therefore, sensing the delay reads the data stored in device 50.

The inductance, capacitance and density of state (the number of available electron states per unit volume and energy) of circuit elements 33, 55, 34 and 37 in circuit 50 (FIG. 4) affect the delay (and therefore the speed of operation) of circuit 50. Depending on the application, values for such parameters may be different from the values described below in reference to FIGS. 13–20. Such parameters can be calculated as follows. The capacitance of each of capacitors 33 and 55 by themselves is calculated, in ferries, by using a simple parallel plate model of the type well known in the art. For example, one may calculate the capacitance using the area of each terminal of each capacitor, the distance between the two terminals of each capacitor, and the dielectric constant of the material located between two terminals of each capacitor.

When the inductor 34 is added in parallel to the storage capacitor 33, an inductor and capacitor interaction occurs, resulting in a LC circuit having a resonant frequency. Several additional variables (other than those in the previous paragraph) must be used to calculate the charge time for the capacitor 33 in the presence of inductor 34. The inductor 34 has an inductance (measured in henneries) that is calculated using a coil and core model. Such a model may be based on a phenomenon called the "skin effect" as described in "Fundamentals of Electronics" by E. Norman Lurch, John Wiley and Sons, Inc, Second Edition, 1971 at page 236 in Chapter 9 (which chapter is incorporated by reference herein in its entirety). For example, one may calculate inductance using various parameters, such as size of the coil (e.g. area of surface 22 in FIG. 4), the volume and density of the material in the core, and the dielectric constant of the trap material, as would be apparent to the skilled artisan.

Once the inductance of the inductor 34 and the capacitance of capacitor 33 is calculated then the time constant of the LC circuit formed by the interaction between the storage capacitor 33 and the inductor 34 is found (e.g. using a Laplace transform of the type well known in the art). Next, one may compute the difference between the charge time of capacitor 33 in the presence and absence of charges in trap material 37. This difference is used by sensor 56 to determine whether or not a charge was stored in trap material 37 (e.g. whether or not a bit 1 is stored in circuit 50 when used as a part of a memory cell).

Figure 6:
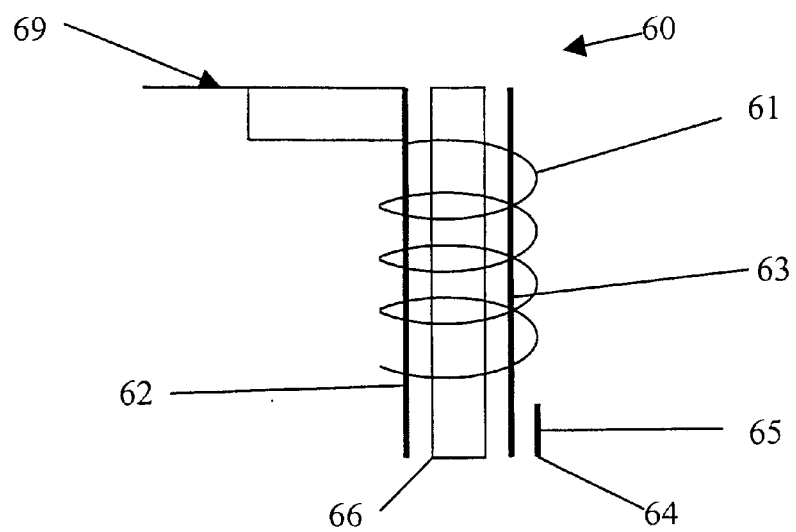
FIG. 6 illustrates a symbol for the inductive capacitor.

Storage capacitor 33, inductor 34 and sense capacitor 55 together are represented, in circuit diagrams of one embodiment, by a single symbol 60 (FIG. 6). Such a symbol 60 may be used, for example, in a programmed computer by circuit modeling software for interpreting instructions in hardware description languages, such as SPICE or VERILOG. Such software (which is normally stored in the memory of the computer) includes instructions to model a capacitor in the normal manner, except that the capacitor charges and discharges significantly faster than (e.g. twice as fast or 10 times as fast as) a conventional capacitor of the same rating. The higher speed effectively models the inductive effect of the inductive storage capacitor represented by symbol 60. One embodiment of the inductive storage capacitor is operated at speeds above 1 GHz, which overcomes a prior art problem of speed and response time of conventional memory.

Therefore, in one embodiment, engineers that design microprocessors, digital signal processors, logic, or memory may use such a single symbol in a circuit diagram (which may be on paper or on a computer screen, depending on the circumstances) to identify a combination of circuit elements that form an inductive storage capacitor as described herein. Thereafter, when the circuit is realized in a semiconductor wafer, an inductive storage capacitor is fabricated as described elsewhere herein.

In one embodiment, symbol 60 has two parallel line segments 62 and 63 (that represent a capacitor), and a spiral 61 (that represents an inductor) wrapped around the two parallel line segments 62 and 63 (which may be shown, for example, as vertical lines). Note that in the embodiment illustrated in FIG. 6, a capacitor symbol well known in the art and an inductor symbol well known in the art are overlapped, and an optional rectangular box 66 is added to represent storage, thereby to form the new symbol 60. Optionally, the two symbols may be shown connected, at one end, to a common line segment 69, which represents, for example, an input line to the device (for connection to a voltage source). Note that in the embodiment illustrated in FIG. 6, a horizontal line 69 is shown connected to each of (1) line segment 62 and (2) spiral 61.

Symbol 60 optionally has a third parallel line segment 64 that is shorter than the two parallel line segments 62 and 63. When present, the third parallel line segment 64 is set apart from spiral 61. Also, symbol 60 optionally has a box 66 (which represents trap material 37) located between the two parallel line segments 62 and 63. An output line 65 may be connected to the third parallel line segment 64, when present. Although specific embodiments of symbol 60 are illustrated in FIG. 6, other such symbols will be apparent to the skilled artisan.

Figure 7:
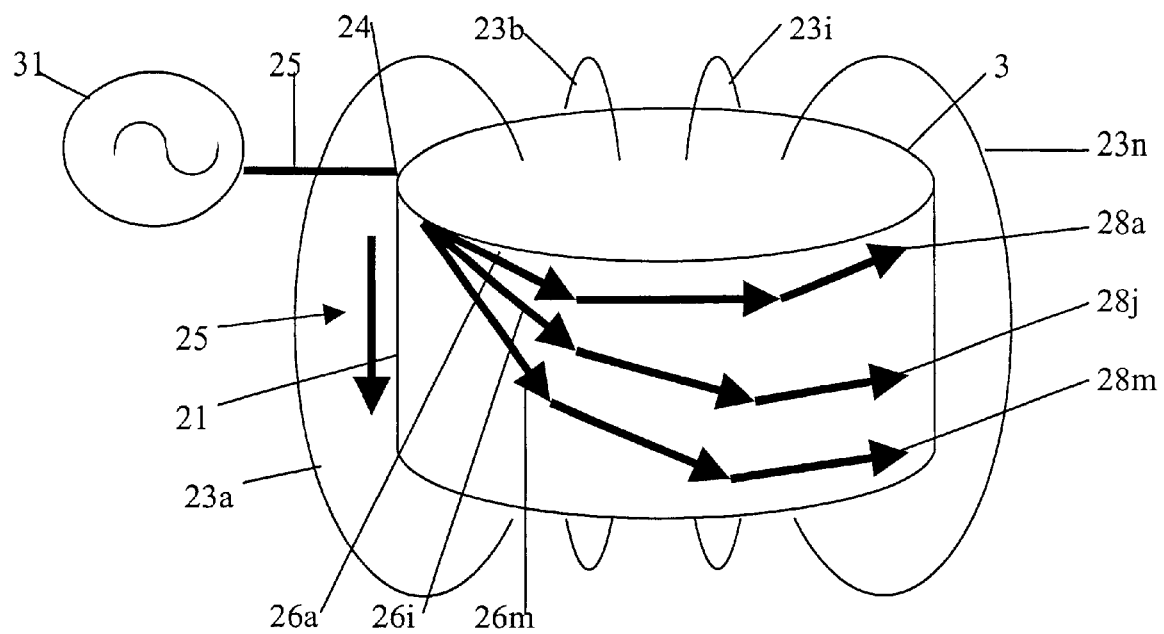
FIG. 7 illustrates electron flow on an outer surface of the inductive capacitor of FIG. 1.

When voltage source 31 (FIG. 7) is applied to an input trace 25 connected to a terminal 24 located at one end of surface 21 of conductive sleeve 3, a number of electron waves 26A–26M (wherein A≦J≦M, M being the total number of waves) originate at terminal 24 and travel around surface 21, as shown by waves 28A–28M (which represent waves 26A–26M after a time delay), thereby to form a current flow. Although terminal 24 where electron waves originate is located at the end of surface 21 of sleeve 3, in other embodiments, terminal 24 is separated by a distance from the end, as long as an inductive effect is present. As discussed elsewhere, the inductive effect must be sufficient to move free electrons into trap material 37. The inductive effect arises from the flow of electrons along a path defined by physics, as they move across surface 21. This movement is defined by Boltzmann's principle which states that electron groups or waves vectors (momentum) move at a velocity and across the conductive surface generating an electromagnetic force (emf) that in turn creates an inductive field 23 (illustrated by flux lines 23A–23N).

The carrier flux or field strength that is created by waves 28A–28M is calculated using Newton's Law of Motion. The electrons gain momentum as they move across the surface 21 they use a spherical parabolic path (as illustrated by waves 26A–26M and 28A–28M) following the laws of motion and follow the band structure of the material. As momentum is gained across the surface the field strength and direction are determined. The field strength and flux are a function of both the capacitor and inductor resonant frequency. As the inductive field 23 (FIG. 7) is built, the surface 21 collects electrons, and plug 4 has an opposite charge forming thereon. The free electrons migrate away from surface 22, toward the center of plug 4 and become resonant, e.g. at surface 44. As this build up of charges occurs, surface 46 of element 45 is also charging. As the charges collect on element 45, a voltage is created on element 45, and this voltage causes a current to start flowing through sensor 56.

Figure 8:
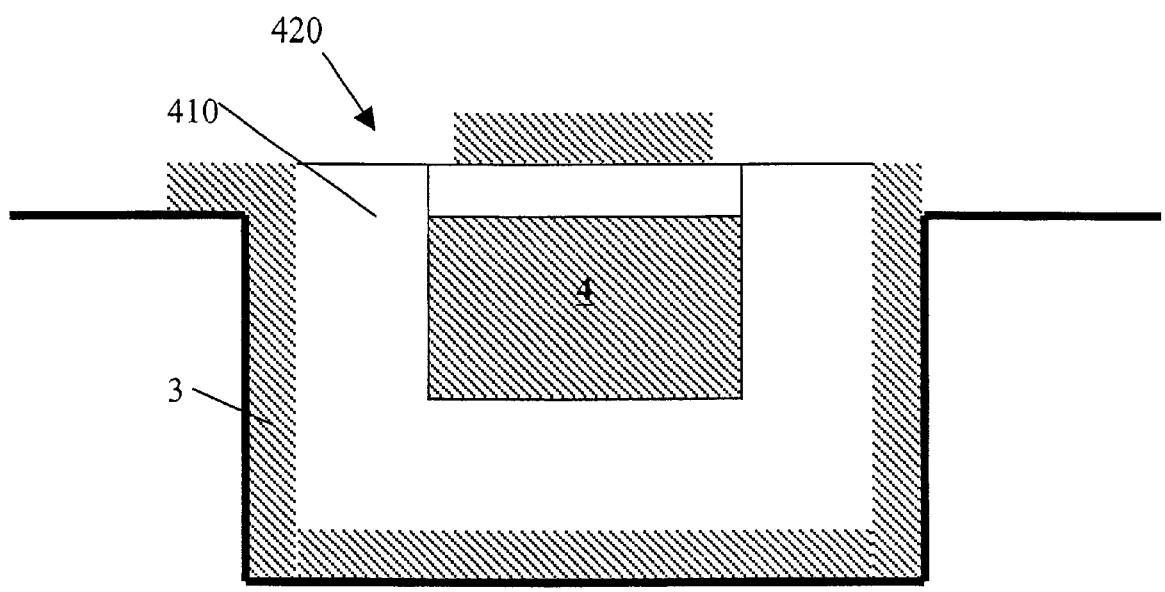
FIG. 8 illustrates an inductive capacitor that does not hold charge when powered down.

In one embodiment, a dielectric material 410(FIG. 8) between conductive sleeve 3 and plug 4 may be a single layer of dielectric material (like silicon nitride $Si_3N_4$). Such a device 420 that has a single dielectric layer still contains a capacitor and inductor as described above, but does not have the ability to store a charge. This device operates at resonant frequency and is used in radio frequency (RF) circuits, e.g. for band pass or tuning filters used in communication device. This design has advantages in that the inductor/capacitor is manufactured in a smaller element on the silicon wafer and requires less surface area than conventional RF circuits.

Figure 9:
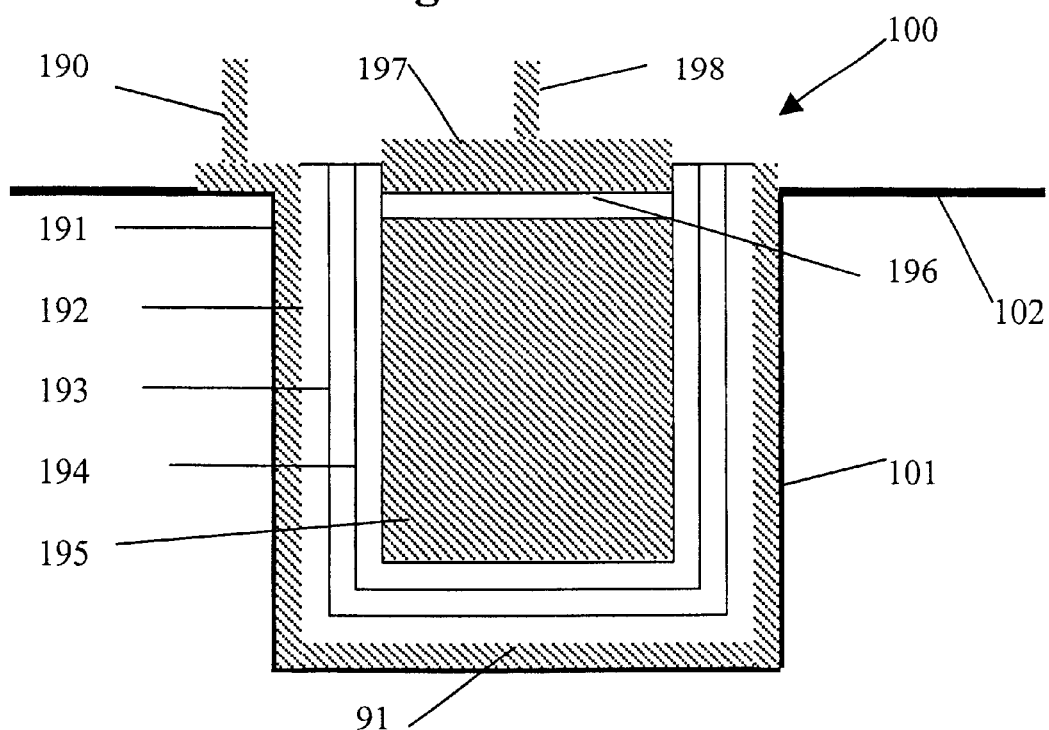
FIG. 9 illustrates a cross section of the inductive storage capacitor.

FIG. 9 shows a cross section of an inductive storage capacitor 100 of the type described above, implemented in a via hole 101 formed in a semiconductor material 102 (such as raw silicon or in an epitaxial layer). Inductive storage capacitor 100 includes a first layer 191 of aluminum, which forms the conductive sleeve 3, and connected thereto is a trace 190. Inductive storage capacitor 100 also includes a trap material 5 formed at an interface between a second layer 192 of a silicon (Si) dielectric material and a third layer 193 of silicon dioxide ($SiO_2$). Therefore, trap material 5 of this implementation is a silicon—silicon dioxide (Si—$SiO_2$) interface. Inductive storage capacitor 100 also includes a fourth layer 194 of silicon nitride ($Si_3N_4$) that provides a dielectric of high value for the storage capacitor and inductor elements. Inductive storage capacitor 100 further includes a fifth material which is a conductive material like aluminum or copper and which forms a plug 195 that is located inside the via hole 101.

Depending on the implementation, inductive storage capacitor 100 also includes a dielectric material 196 located over plug 195, to form the dielectric element of sense capacitor 48. Note that dielectric material 196 can be formed of any semiconductor material commonly used for insulation such as silicon and silicon oxide, although in one embodiment material 196 includes silicon nitride ($Si_3N_4$) which ensures that junctions formed therein have better thermal conductivity, and better adhesion than other semiconductor materials. Located over dielectric material 196 is a layer of conductive material 197, like aluminum or other conductive material, which forms sense capacitor 55. This material 197 is then connected to a sensor through a lead 198. In one or more alternative implementations, materials 196–198 are not used and instead, trace 190 is connected to a voltage source 31 and also to a sensor 36 as described above.

In one implementation illustrated in FIG. 9, a device (that includes inductive storage capacitor 100) has, attached to conductive sleeve 3, a floor 91 also formed of first layer 191. Floor 91 overlaps at least a region of plug 195 when viewed in a direction perpendicular to plug 195. The combination of sleeve 3 and floor 91 is also referred to as a "cup-shaped element", and in one embodiment has an aspect ratio in the range of 1 to 5 although other aspect ratios may be used in other embodiments.

Conductive layer 197 together with sleeve 3 and floor 91 substantially enclose plug 195. So, any charge that may be stored in the region (also called "storage tunnel") between plug 195 and such surrounding elements is less likely to be affected by alpha particles than in prior art devices, such as flash memory. At the same time, the storage tunnel holds a charge in a non-volatile manner, even when no power is supplied to the device as described elsewhere.

Figure 26A:
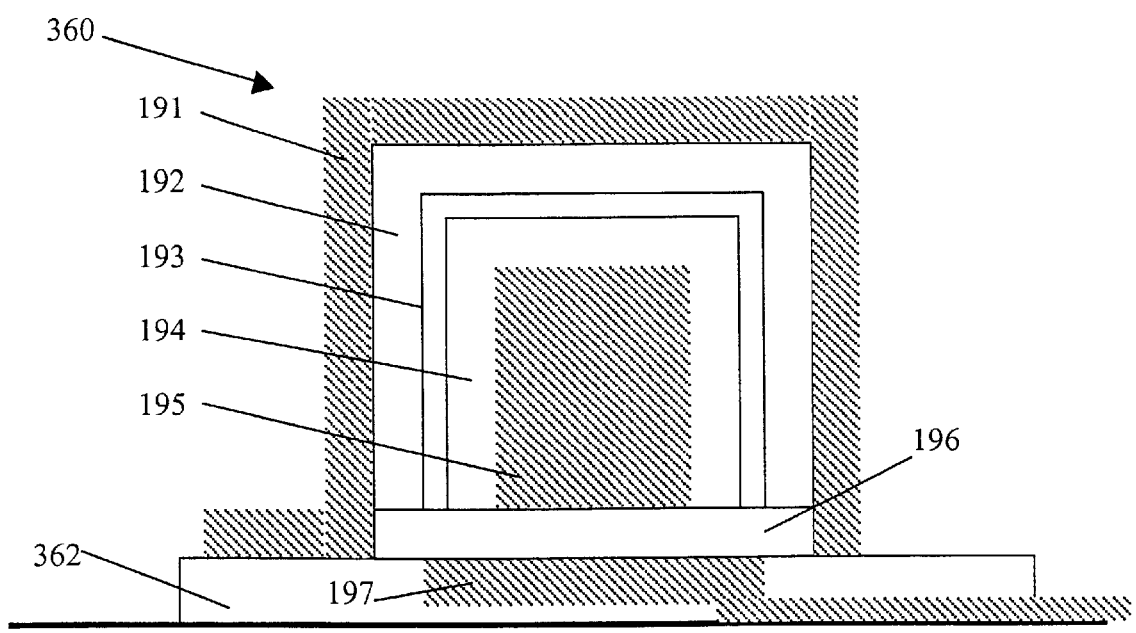
FIGS. 26A, 26B, and 27–29 illustrate, in cross-sectionional views, various embodiments of an inductive storage capacitor in an upside down configuration relative to FIG. 9.
Figure 26B:
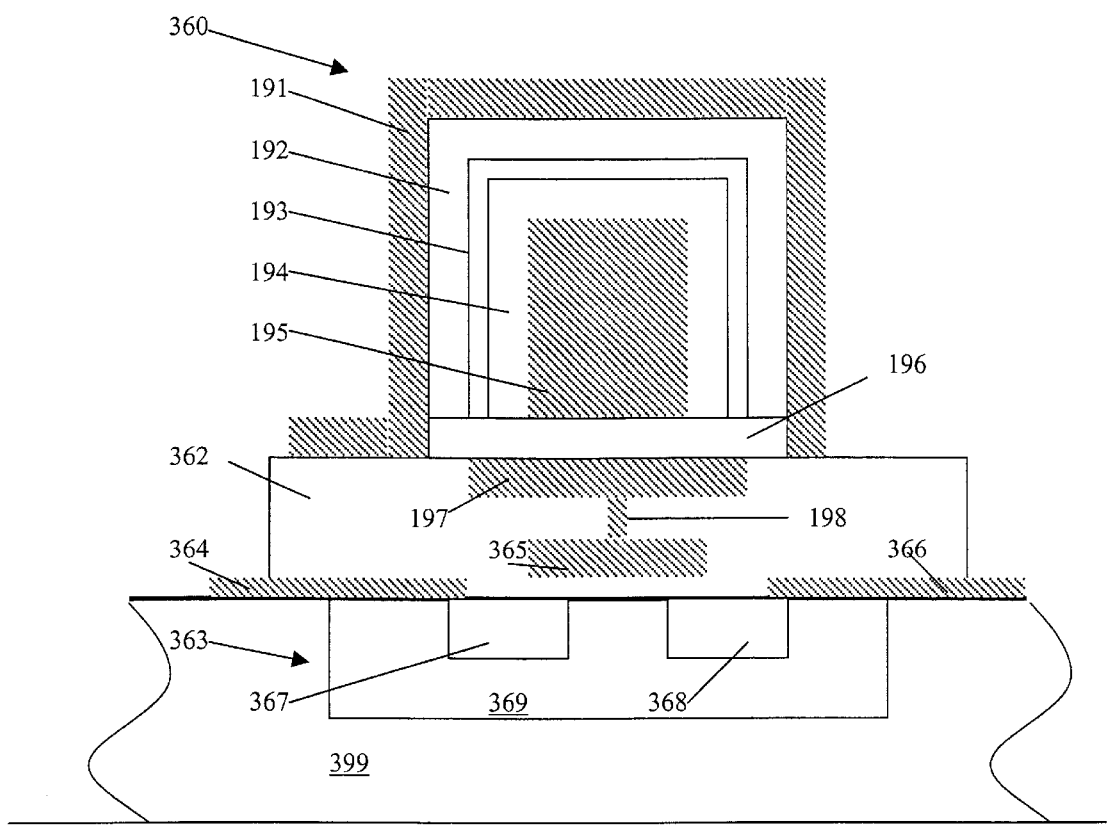
Figure 27:
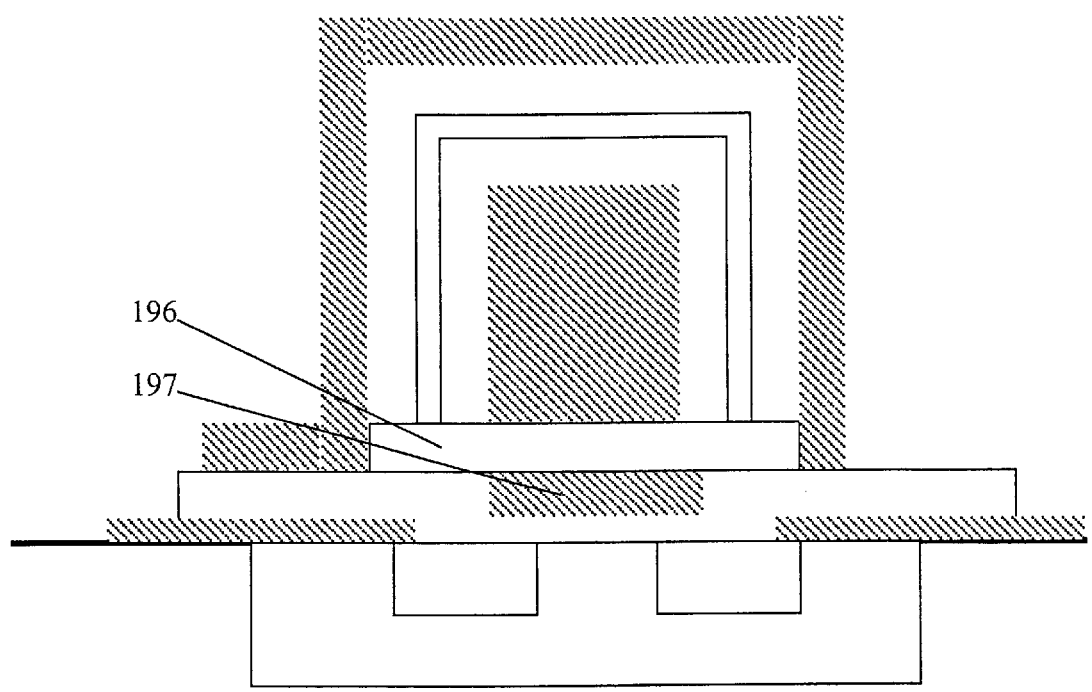
Figure 28:
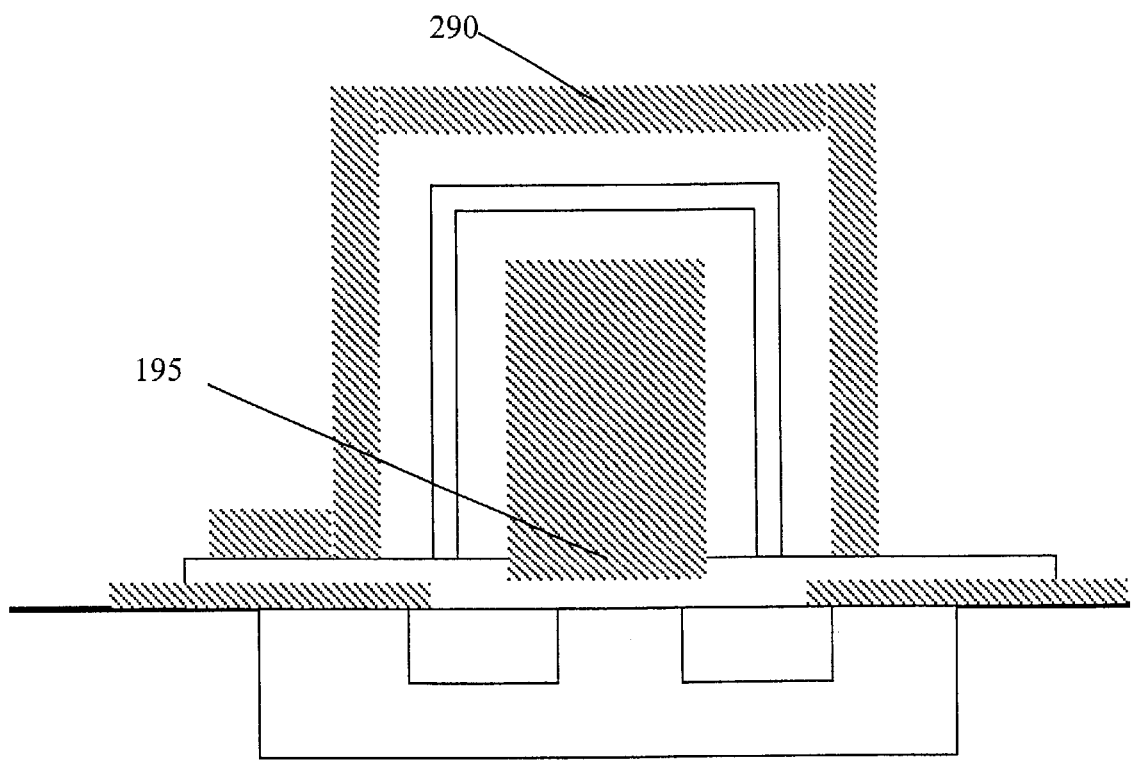

Instead of floor 91, a roof 290 may be attached to capacitor 100 as illustrated in FIGS. 26–28. Roof 290 (FIG. 28) is located at the top of the sleeve (and is also called a "cap"). Note that in another implementation, such a structure does not have a cap or a cup, i.e. has only the sleeve. Referring back to FIG. 9, floor 91 which may be an artifact of a manufacturing process, may be eliminated as discussed below in reference to FIG. 17, thereby to ensure that the resultant device effectively functions as an inductive storage capacitor 100.

Figure 10:
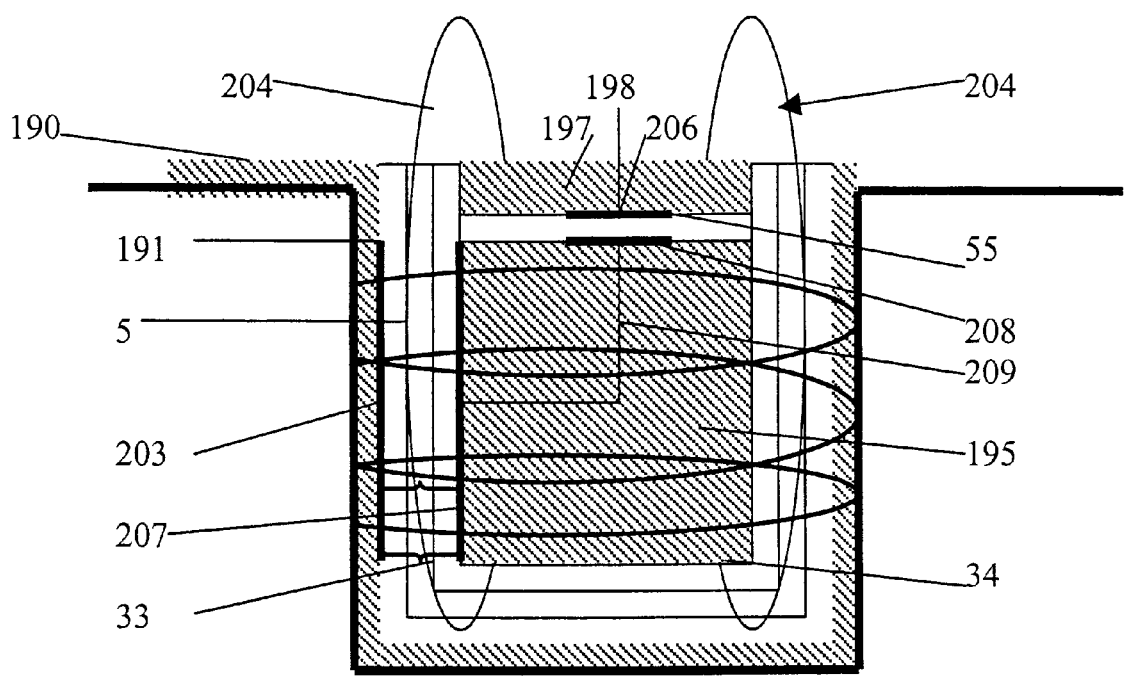
FIG. 10 illustrates the cross section of FIG. 9 with superimposed thereon symbols of the circuit elements formed by the structure.

Circuit elements of inductive storage capacitor 100 are shown overlayed onto a cross-sectional view in FIG. 10. The interaction of the coupled devices creates the equivalent circuit to the circuit in FIG. 5. The input lead 190 is connected to layer 191 (FIG. 10) which forms a first terminal 203 of a storage capacitor 33. Conductive sleeve 3 also forms a coil of the inductor 34. Plug 195 forms a core of the inductor 34. During operation, inductor 34 creates an electrical field 204 around the plug 195. Plug 195 forms an electrical path 209 from the second terminal 207 of storage capacitor 33 to a terminal 208 of the sense capacitor 55. Conductive material 197 forms a second terminal 206 of sense capacitor 55, which is connected by lead 198 to a sensor.

Figure 11:
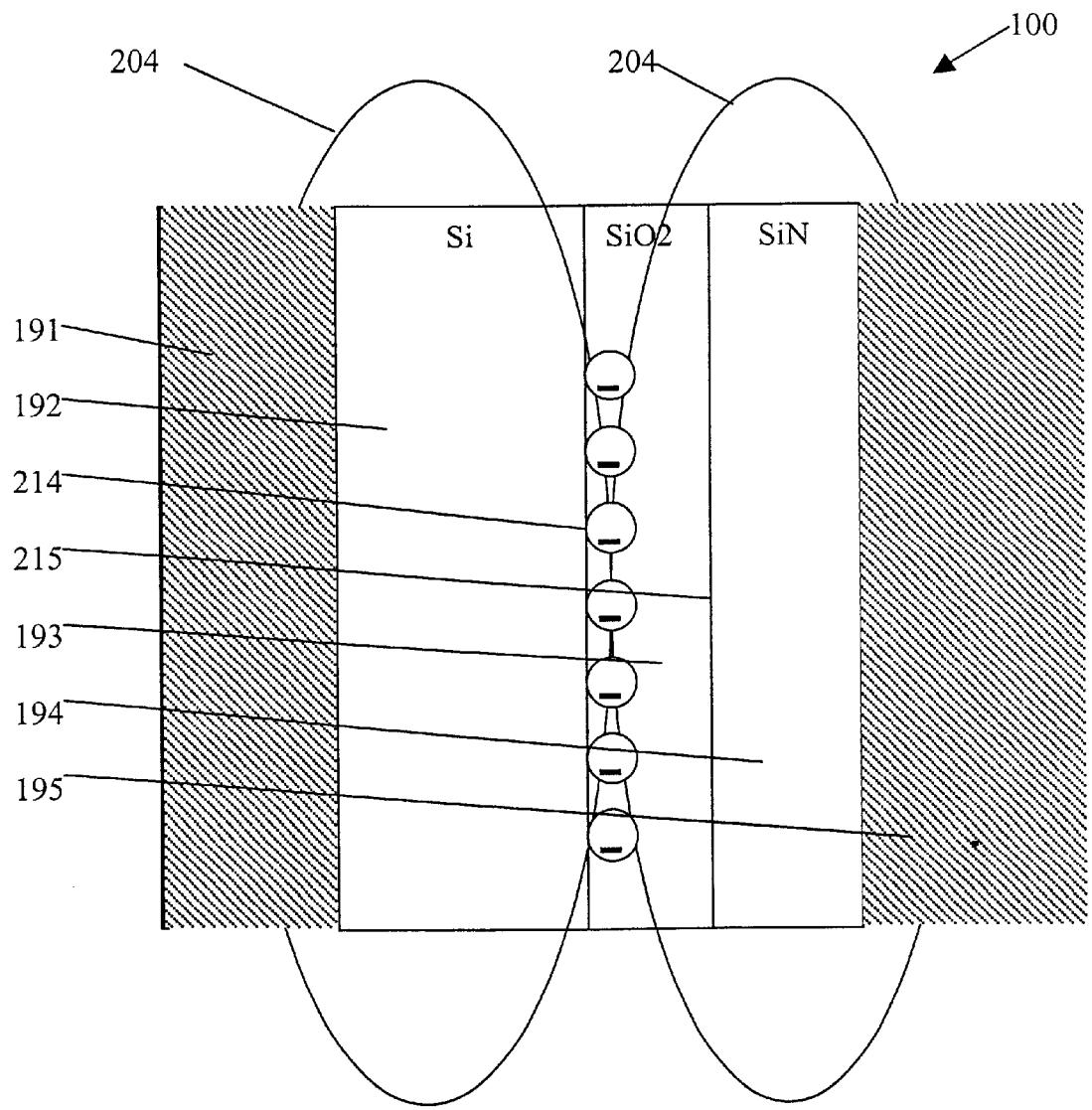
FIG. 11 illustrates, in an enlarged view, an interface formed between layers 192 and 193 causing the electrons to be stored under the influence of an inductive field.

The storage of electrons in inductive storage capacitor 100 occurs at an interface 214 (FIG. 11) in trap material 5 (FIG. 1), where the inductive field 204 works with the storage capacitor 33 to cause the generation of electron hole pairs to occur in a phenomenon known as 'Trap-to-Band Tunneling (TBT)'. As the input voltage is applied, the electron waves move around first layer 191, thereby to form an inductive field 204. Storage capacitor 33 causes electron to accumulate along interface 214 formed between second layer 192 and third layer 193. Another interface 215 formed between third layer 193 and fourth layer 194 also provides an electron-trapping interface, although not as strong as interface 214. Fourth layer 194 provides a high dialectic material to hold the electrons at interface 215, and to stop the flow of electrons into plug 195. When the voltage level on first layer 191 reaches a maximum, the inductive field 204 collapses causing the electrons to be trapped in trap material 5.

In one embodiment, trap material 5 at interface 214 (FIG. 12) is made up of silicon atoms 220A–220Z (Z being the number of silicon atoms), and oxygen atoms 221A–221X (X being the number of oxygen atoms), wherein X<Z. Although silicon and oxygen atoms were just described in one example, trap material 5 is any material in an amorphous (and vitreous, meaning that the atomic structure is ordered only over short distances) form having free (or dangling) electron bonds. Another embodiment uses trap material 5 in the form of α—quartz which features a perfectly ordered arrangement of Si atoms located at the center of tetrahedral, and oxygen atoms at the vertexes. Each oxygen atom occupies a bridging location and forms two chemical bonds with Si atoms belonging to adjacent tetrahedral.

Figure 12:
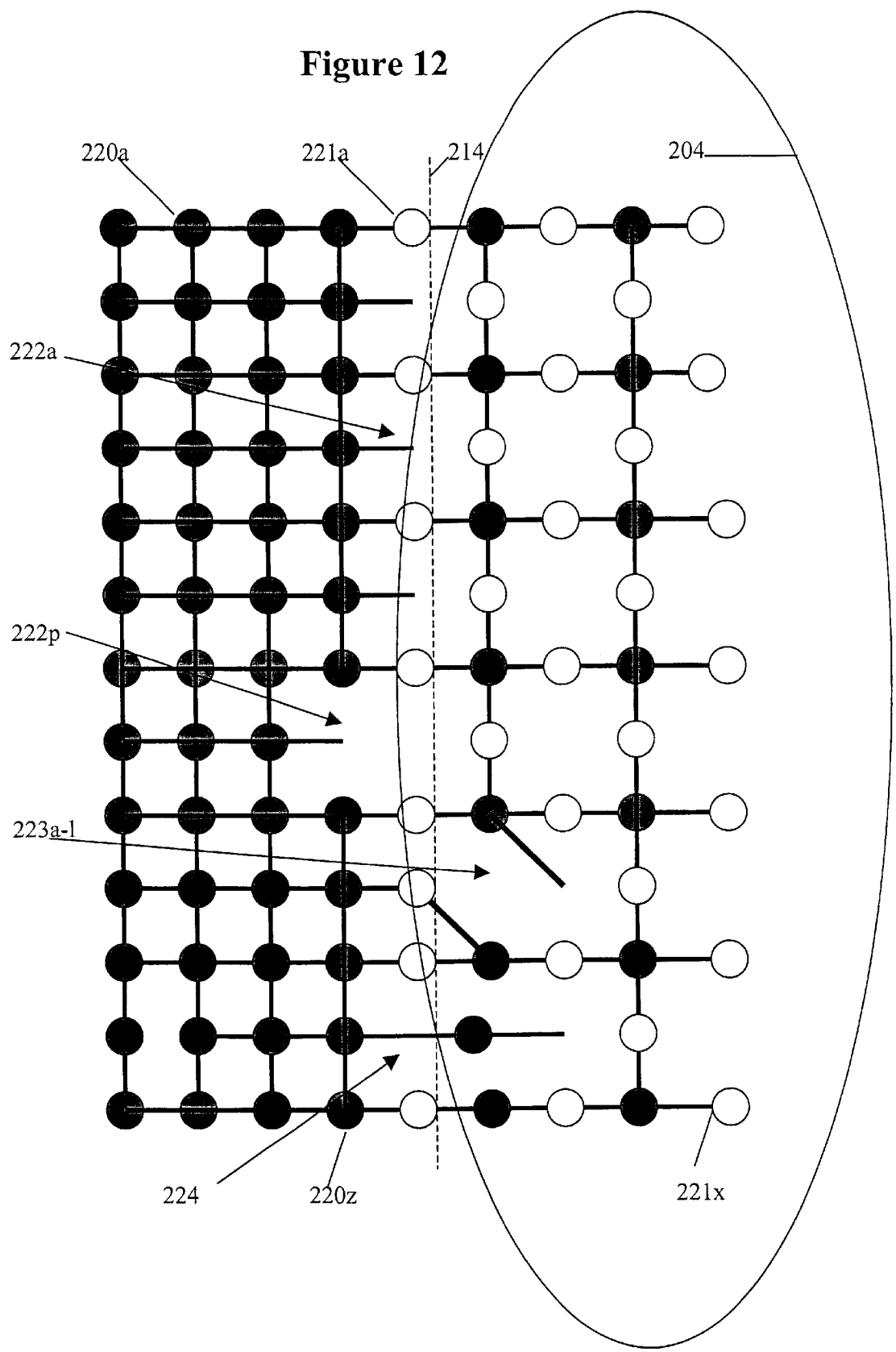
FIG. 12 illustrates the crystal structure of the silicon-silicon dioxide interface where free electrons are trapped in electrons holes.
Figure 13:
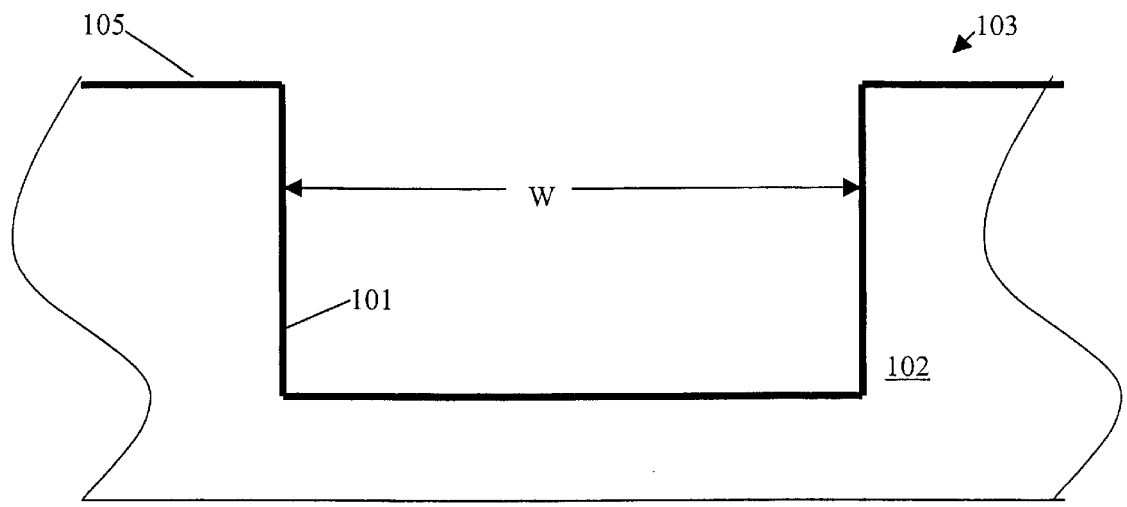
FIGS. 13–20 illustrates, in a cross sectional view, formation of various layers in a via hole of a silicon wafer.
Figure 14:
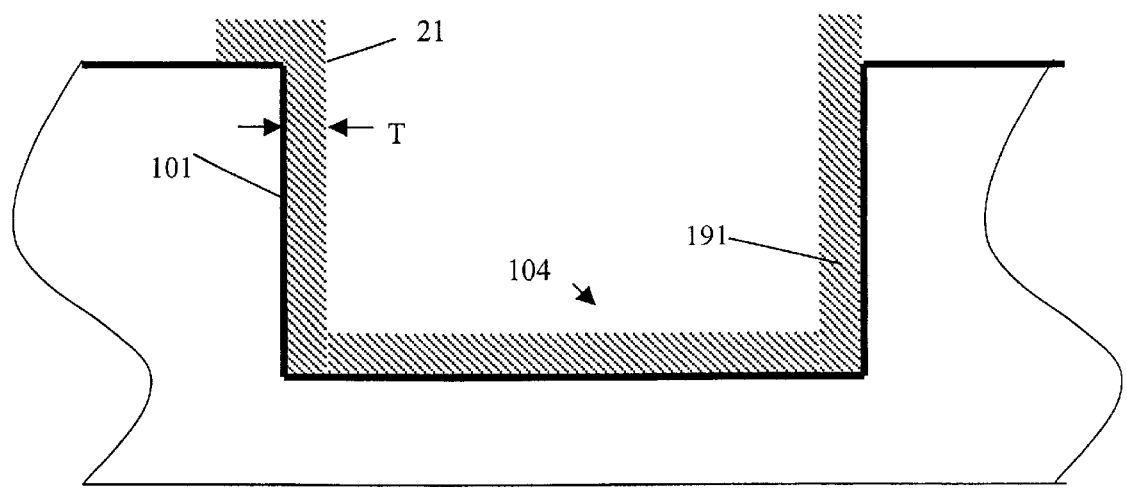
Figure 15:
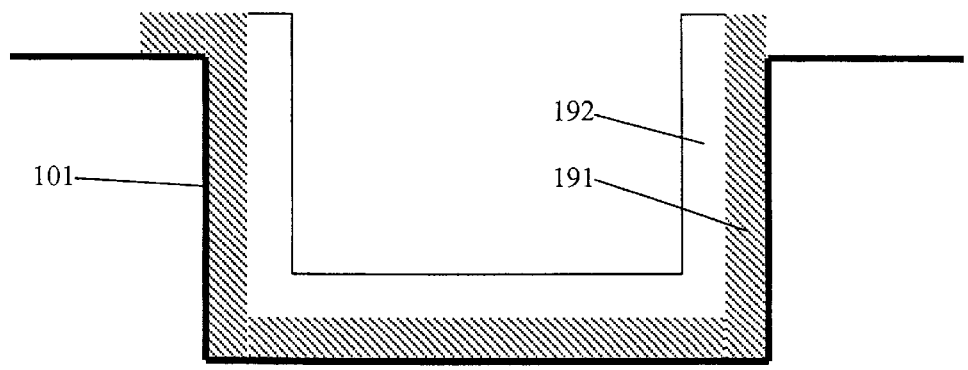
Figure 16:
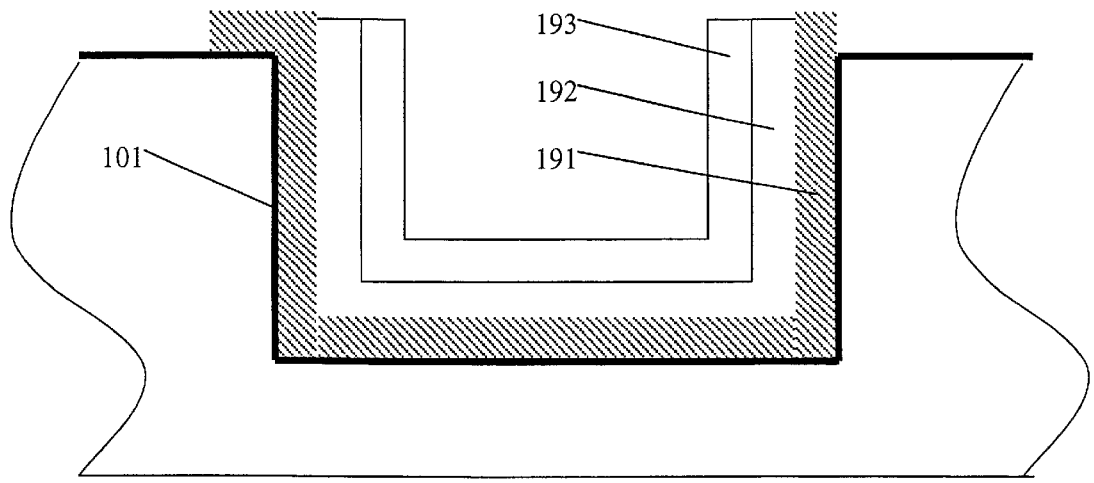
Figure 17:
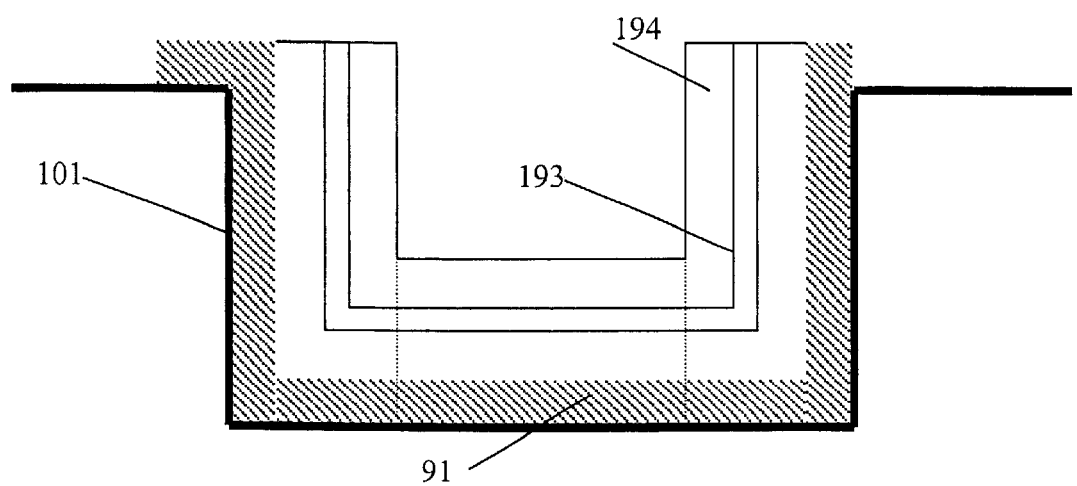
Figure 18:
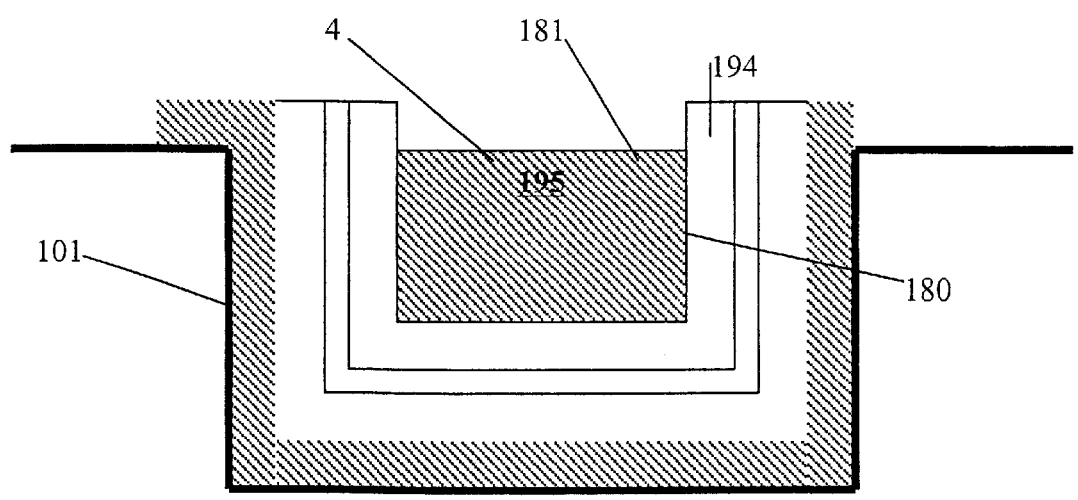
Figure 19:
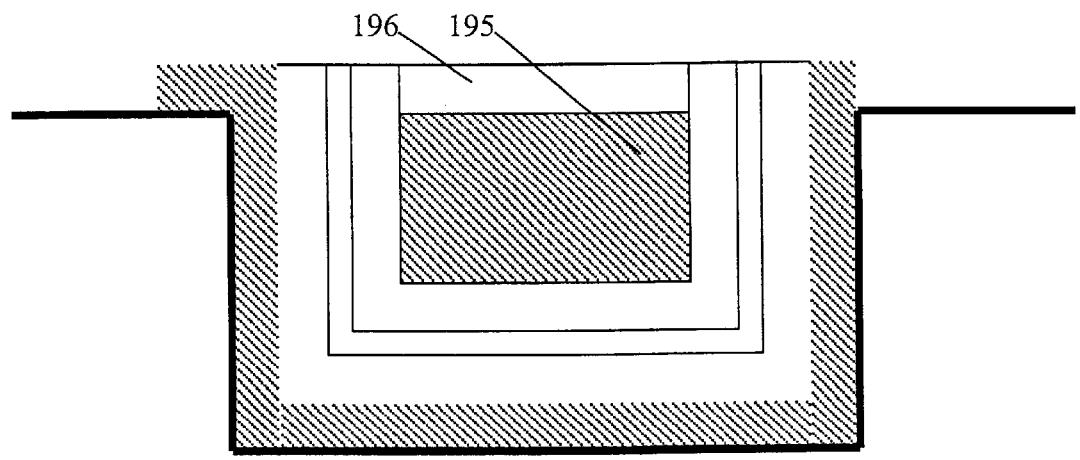

In the example illustrated in FIG. 12, trap material 5 has dangling electron bonds 222A–222P, and also has stretched silicon-to-silicon Si—Si bonds 223A–223L. The dangling electron bonds 222A–222P are randomly distributed, and allow for electrons to rapidly exchange charges, also known as 'fast surface states,' and can become hole traps as they can capture and release electron carriers. Hole traps can be of two types: acceptor traps (that are empty holes) and donor traps (that are occupied holes).

Figure 5:
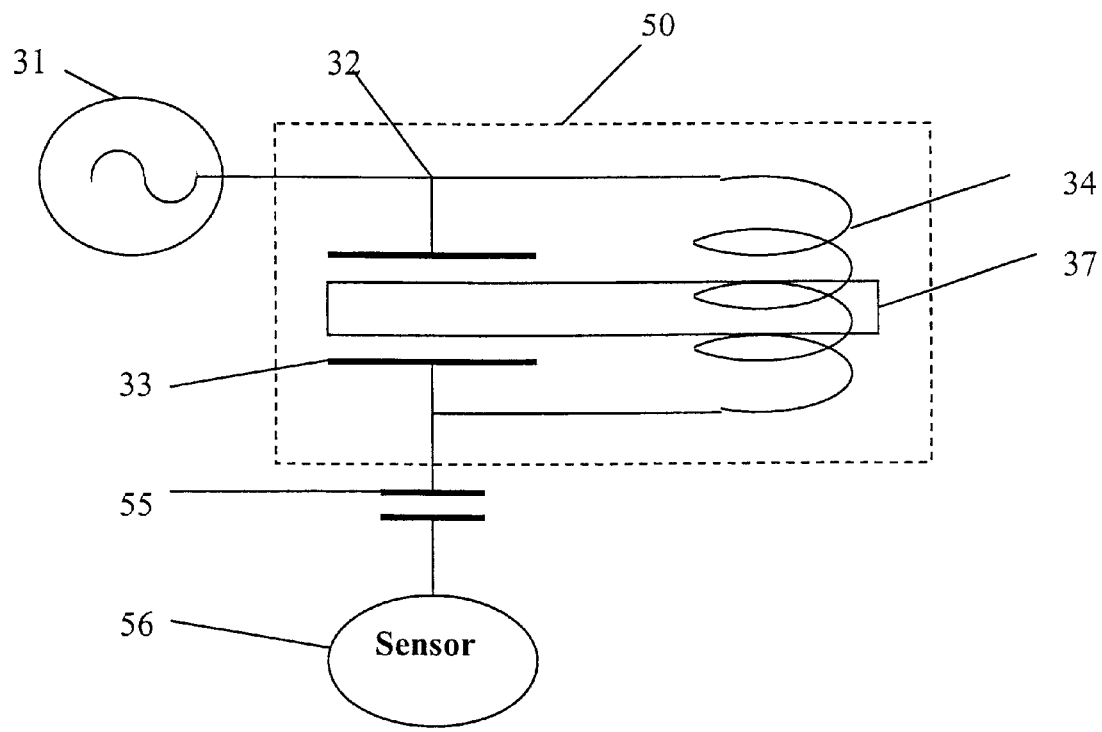

When acceptor traps are empty or neutral and a field is generated and electrons start moving, these traps are filled with negatively charged electrons and become donor traps, which are neutral when occupied (and are positively charged). Depending on the implementation, such traps may be filled in, e.g. 327 picoseconds. Storage capacitor 33 and inductor 34 (FIG. 5) cause an electrical field 204 (FIG. 12) along interface 214 to expand and collapse, which in turn causes electrons to move into and become trapped in this interface 214. As the electrical field 204 expands the amount of work or kinetic energy used to move the electrons into the traps is measured by monitoring voltage or current produced by the sense capacitor 55 (FIG. 5). If interface 214 (also called "storage tunnel") already contains trapped electrons, then more electrons will be free to migrate to the sense capacitor 55 and the output of the sense capacitor 55 will more closely follow the source 31 of the input voltage. If interface 214 does not contain trapped electrons then most of the kinetic energy will be used to move electrons to interface 214 (FIG. 12) and trap them. The output charge of sense capacitor 55 will be delayed until interface 214 reaches a full or equilateral state.

In one embodiment of the device, a via hole 101 (FIG. 13) is created in semiconductor material 102 (such as a wafer of silicon, or germanium) that may be present in a semiconductor substrate 103. In one example a circular three-micron wide by 10 microns deep hole 101 with an aspect ratio of 3 to 10 is created in semiconductor substrate 103. The shape of via hole 101 in cross-section is circular, elliptical, square, triangular or any other shape that allows a conductive sleeve 3 (FIG. 14) to be built separate and distinct from a core 195 (to form an inductor when a trace is coupled to one end of the conductive sleeve 3). Moreover, as noted elsewhere, the sidewall of via hole 101 can be slanted, so that core 195 has the shape of a frustrum of a cone. The width W (FIG. 13) of via hole 101 is sufficiently large enough to allow hole 101 to accommodate at least a core, trapping material surrounding the core, and a conductive sleeve surrounding the trapping material (as discussed above in reference to FIG. 1), each of uniform thickness as discussed below.

As process technology evolves the aspect ratio of height to width is changed to allow for the creation of devices of different resonant frequencies. The ratio is determined by the design of the inductive storage capacitor, because the capacitance and the inductance depend on the speed of operation of the device (which in turn is determined by a resonant frequency).

Thereafter, a layer 104 (FIG. 14) of a conductive material, like aluminum or copper, is formed in hole 101. Conductive sleeve 3 is formed as a sidewall in contact with a surface of via hole 101. Depending on the manufacturing process, the just-described sidewall is perpendicular to the surface 105 of semiconductor substrate 103, but may be angled to reduce faseting and trenching of layers that are to be deposited in the space defined by conductive sleeve 3. An additional step may be performed, to deposit a dielectric material between a surface of via hole 101 and conductive sleeve 3 to protect operation of sleeve 191 in the presence of impurities in substrate 102.

A layer 104 of electrically conductive material (like aluminum, copper, platinum, titanium, or polysilicon) is deposited (FIG. 14) into the via hole 101 using a PVD processing. In one embodiment the sleeve thickness T, e.g. of 10 angstroms of conductive aluminum material was used. A Rapid Thermal Process (RTP) may be used to anneal the surface 21 if the surface 21 contains spikes, e.g. created by the physical vapor deposition (PVD) process.

In one embodiment, a second layer 192 (FIG. 15) is formed (e.g. of silicon (Si)) on surface 21 of conductive layer 191. Second layer 192 is applied using, e.g. chemical vapor deposition (CVD) process to deposit 30 angstroms (or 3 $\mu$m) thick silicon. Next a third layer 193 (FIG. 16) is formed, e.g. silicon dioxide ($SiO_2$) is deposited at a thickness of 100 angstroms (or 10 $\mu$m) over second layer 192 using a CVD process creating trap material 5 (e.g. a silicon-silicon dioxide interface junction). A fourth layer 194 (FIG. 17) is formed, e.g. of silicon nitride ($Si_3N_4$) which has a high dielectric value is then deposited using a CVD process, over third layer 193 at a thickness of 30 angstroms (or 3 $\mu$m). After formation of layer 194, a hole is etched in floor 91, through layers 191–194, in one embodiment to obtain a desired resonant frequency, inductance or capacitance, or to eliminate secondary effects. Next, a plug 4 (FIG. 18) of a conductive material is formed using a PVD process into the via hole 101 to fill the via hole.

The thickness T of the sleeve and the area of surface 21 (of sleeve 191) determine the sheet resistance, which can be used (as discussed above in reference to FIGS. 1 and 2) to calculate the inductance and the capacitance of inductive storage capacitor 100. Such values are used to tune the device to operate at any desired resonant frequency. The resistance and capacitance are used to compute an RC transmission line value, and the circuit delay is calculated therefrom, to determine the proper timing for reading the charge status of the device to determine if the trap material contains a charge. The size (diameter and height) of plug 4 determines the area of surface 180, that in turn is used to calculate the capacitance. The density of plug 4 is used to calculate the inductance. The area of an end surface 181 of plug 4 is determined to calculate the capacitance of a sense capacitor 48. By changing the height and diameter of the core (formed by plug 4) different values are achieved for each of the inductance, and the two capacitances, to tune the device for a specific resonant frequency for the operation of the device.

In one embodiment, a dielectric layer 196, e.g. of silicon nitride ($Si_3N_4$) (FIG. 19) of high dielectric value, is then deposited using a CVD process, over plug 4 at a thickness of 200 angstroms or 20 $\mu$m. A conductive layer 197 (FIG. 20), e.g. of polysilicon (or other conductive material like aluminum) is deposited using a CVD or PVD process over the dielectric layer 196 to form sense capacitor 48. The surface area of a portion of layer 197 used to form sense capacitor 48 is calculated to determine the capacitance of sense capacitor 48.

Figure 20:
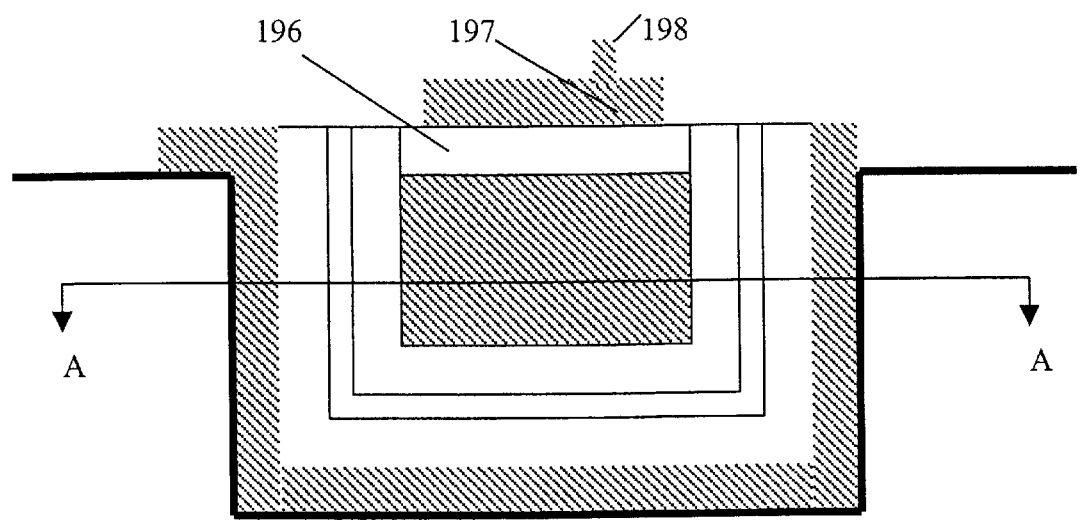
Figure 21:
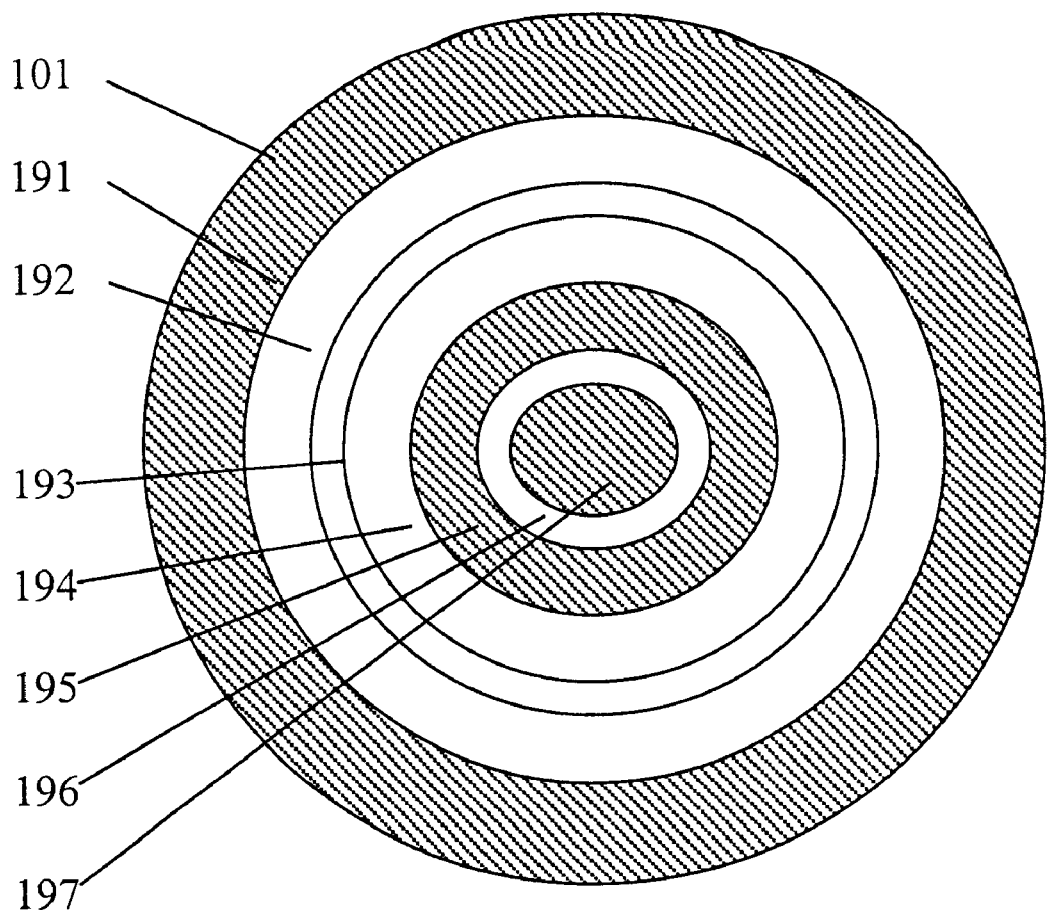
FIG. 21 illustrates a plan view of the inductive storage capacitor structure illustrated in FIG. 20, along the direction A—A. via hole on the silicon wafer.

Although other cross-sections may be used in other embodiments, in one embodiment the device illustrated in FIG. 20 has a circular cross-section (FIG. 21) when viewed along the section line AA (FIG. 20). Specifically, each of layers 191–194 have circular cross-sections and form concentric circles surrounding one another, with layer 191 being the outermost layer. Innermost layer 194 surrounds core 195 that also has a circular cross-section.

Figure 22:
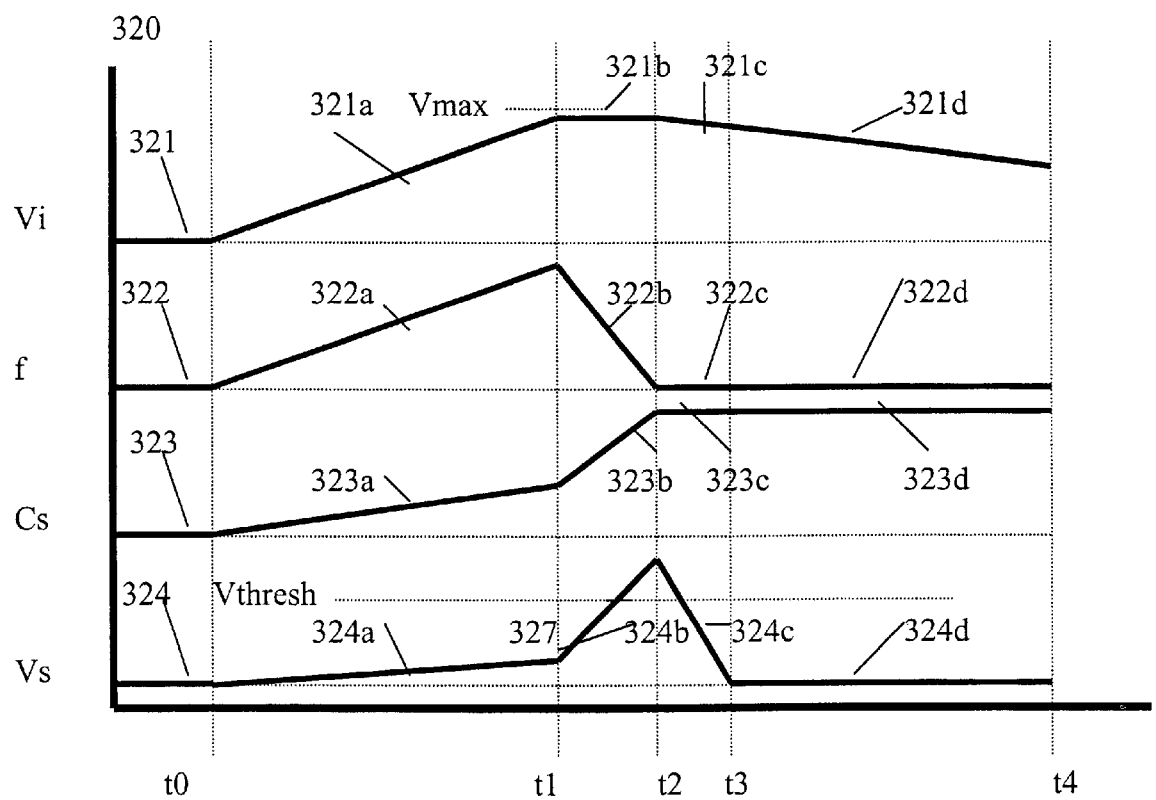
FIG. 22 illustrates a timing diagram for reading a discharged state and writing a charged state.
Figure 23:
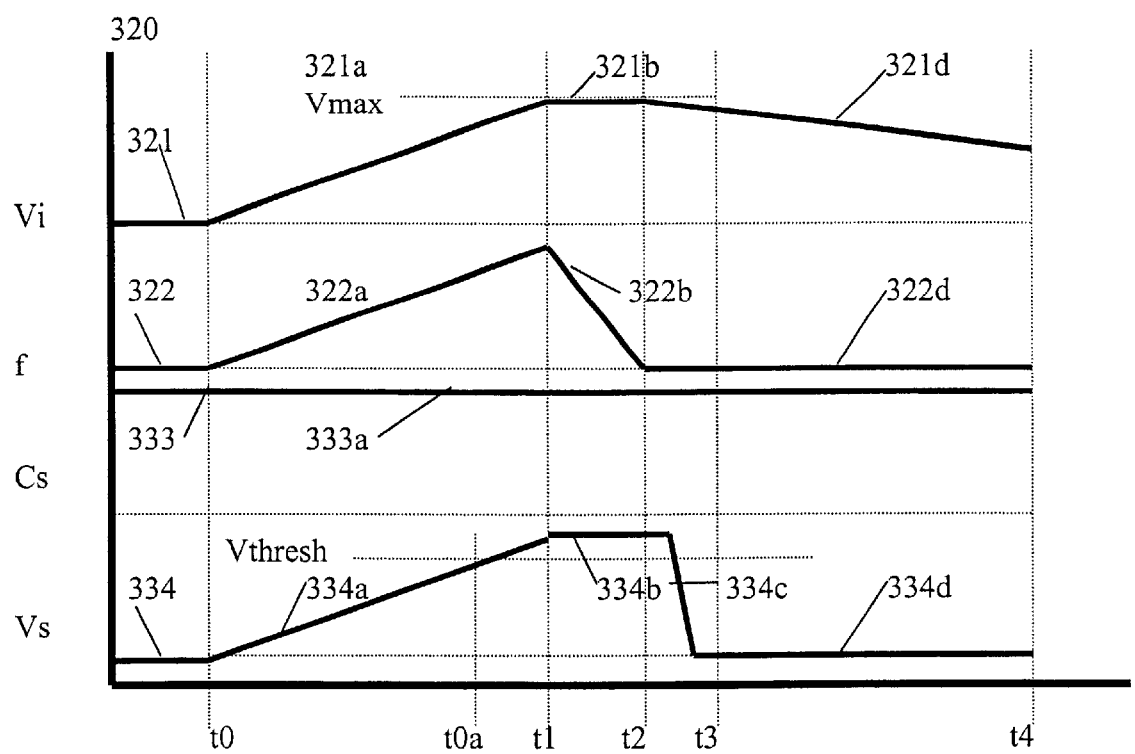
FIG. 23 illustrates a timing diagram for reading a charged state and writing a one state.

In one embodiment, during operation, inductive storage capacitor 100 is charged and discharged as illustrated in FIGS. 22–25. FIG. 22 shows the timing sequence for reading inductive storage capacitor 100 that has a discharged state initially at time t0 (shown on the X axis), and for writing into inductive storage capacitor 100 a charged state by time t4. Specifically, curves 321–324 represent, along the Y axis the input voltage Vi, inductive flux F, stored charge Cs, and sensor voltage Vs respectively.

At time t0, input voltage Vi, inductive flux F, stored charge Cs, and sensor voltage Vs are all zero. At time t0 a signal of voltage Vmax (e.g. 3V) is applied to trace 25 (FIG. 4), and in response the voltage at terminal 24 starts to rise as shown by segment 321a of curve 321 until voltage Vmax is reached at time t1. Simultaneously, a voltage-induced inductive flux F is formed as shown by segment 322a. This inductive field 23 (FIG. 4) is present between the storage capacitor elements 21 and 22, and causes free electrons to collect in trap material 5 (FIG. 1), as shown by segment 323a of curve 323. As both capacitor 29 (FIG. 2) charges and inductive field 23 increases, the electron population in trap material 5 increases. Therefore, at time t1, a charge C1 is stored in trap material 5. Charge C1 is smaller than another charge C2 that denotes a charged state.

Simultaneously, in the time period t0–t1, sense capacitor 48 starts to charge slowly as shown by segment 324a because most of the energy injected into the inductive storage capacitor 100 is used to move free electrons into storage tunnel formed at interface 214. When the voltage level Vi on the storage capacitor 29 is equal to the supply voltage Vmax at time t1 then the inductive field 23 collapses as shown by segment 322b.

Sense capacitor 48 has an output voltage Vs as shown by segment 324a, and this voltage is tested at time t1 to find out if the energy injected into the inductive storage capacitor 100 has caused the output voltage Vs to rise above a threshold Vthresh. In this example, the output voltage Vs is below the threshold Vthresh, and therefore the state of the inductive storage capacitor 100 is discharged. Instead of having just two states of charged and discharged as described above in reference to FIG. 22, an inductive storage capacitor 100 can have one or more intermediate states, e.g. have a total of four states (indicating four levels of stored charge), if the threshold Vthresh is reached at different time intervals from start time t0 as discussed below in reference to FIG. 25. For examples of implementing such multiple states using a single storage capacitor, see Chapter 6 of the book entitled "Flash Memories" by Paolo Cappelletti et al. Kluwer Academic Publishers, 1999, which chapter is incorporated by reference herein in its entirety.

As inductive field 23 collapses as shown by segment 322b a number of free electrons (representing additional charge C2-C1) enter trap material 5 as shown by segment 323b (between times t1 and t2) and the opposite charges will rapidly collect on sense capacitor 48 as shown by segment 324b (between times t1 and t2). This rapid movement of charges (as shown by segment 323b) causes a voltage and current spike as shown by segments 324b and 324c to occur on the output of sense capacitor 48.

In this embodiment, the output voltage Vs of sense capacitor 55 is monitored by sensor 56 a second time, at time t2, in addition to the monitoring at time t1 as discussed above, to verify that storage of charge C2 (indicative of the read process) has occurred, by checking that Vs has exceeded Vthresh. If inductive storage capacitor 100 is defective, this test fails, thereby to identify a failed device. Therefore, inductive storage capacitor 100 has built in error checking of the type not available in prior art storage capacitors.

If inductive storage capacitor 100 is to be charged after the read process, then the input terminal 24 is disconnected from the voltage supply 31 (FIG. 5) as shown by segment 321d, because a charge has been already stored as described above in reference to FIG. 22. Because the dielectrics are not perfect, some leakage of storage capacitor 100 occurs slowly over time (depending on the dielectric leakage) as shown by segment 321d. This slow decay occurs after time t3, and is insufficient to cause a significant inductive field to be formed (field sufficiently significant to discharge the charge C2 to zero coulombs over the life of the device, e.g. 1 year).

If inductive storage capacitor 100 happens to contain a stored charge prior to the read process (as illustrated by segment 333a in FIG. 23), then during time period t0–t1, voltage Vs (see segment 334a) at the output trace 198 (FIG. 9) of sense capacitor 55 follows the voltage Vi (see segment 321a) presented at input terminal 24. In this case, output voltage Vs exceeds the threshold voltage Vthresh at a time t0a, prior to time t1. Time t0a being smaller than time t1 indicates to sensor 56 that inductive storage capacitor 100 contained a stored charge prior to the read process. In all other respects, inductive storage capacitor 100 operates in the same manner as described above in reference to FIG. 22, including operation of sense capacitor 48 at time t2 to verify that a charge has been stored.

Figure 24:
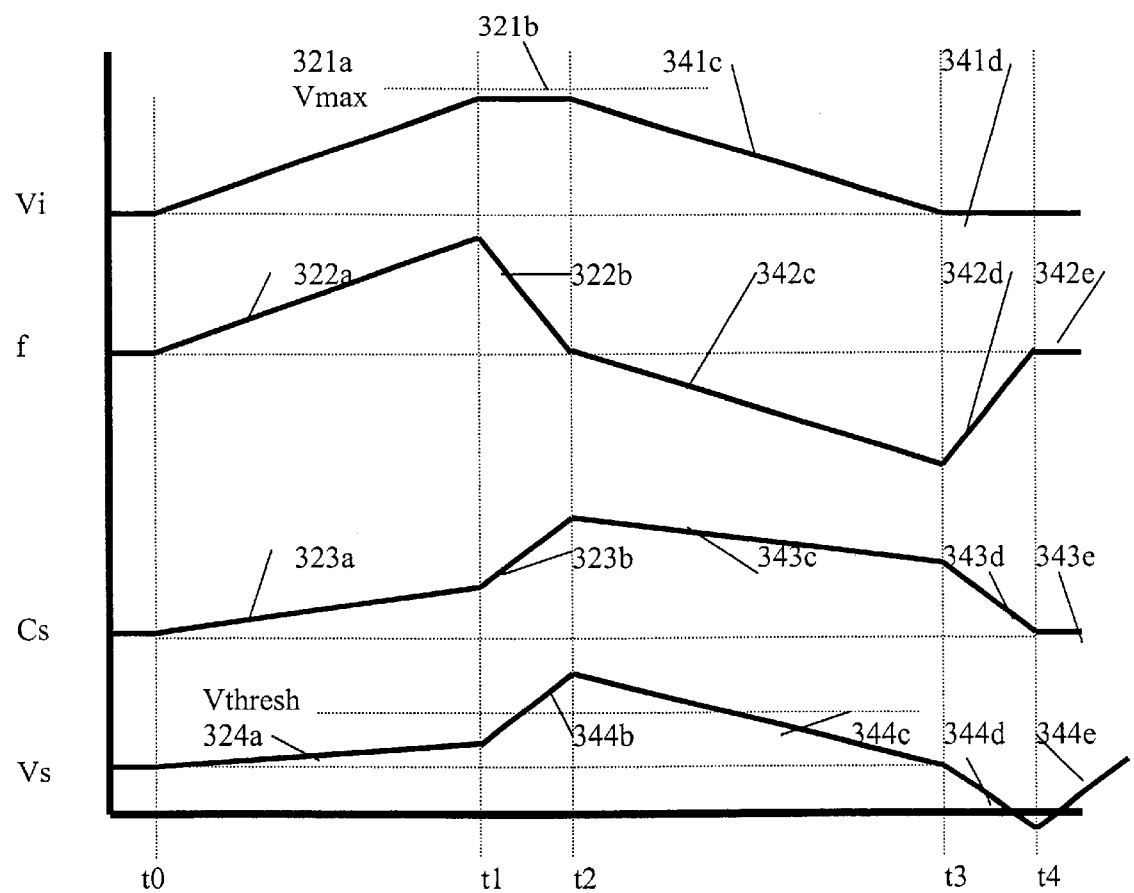
FIG. 24 illustrates a timing diagram for reading a discharged state and writing a discharged state.
Figure 25:
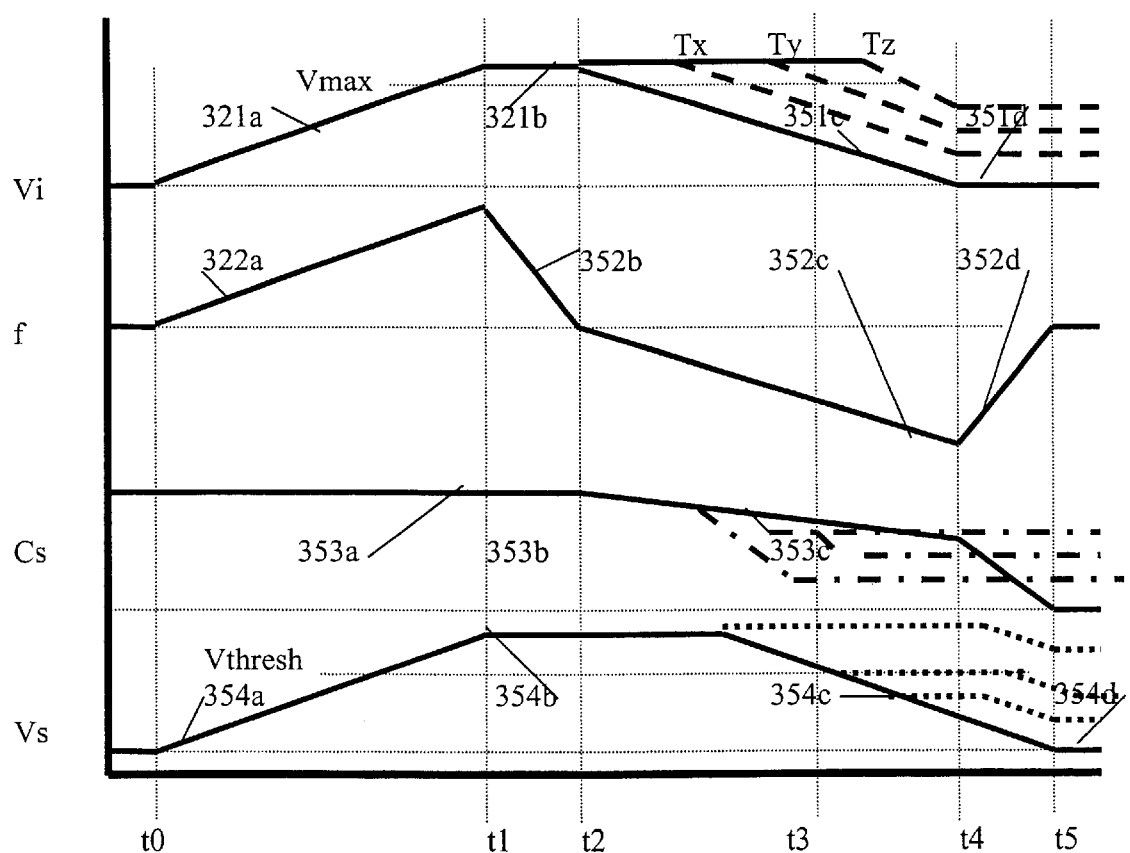
FIG. 25 illustrates a timing diagram for reading a charged state and writing a discharged state.

To store a discharged state in inductive storage capacitor 100, the input terminal of the storage capacitor 29 is grounded (see segment 341c in FIG. 24). Storage capacitor 29 is discharged and opposite polarity inductive field (shown negative in FIG. 24) is generated (see segment 342c). When storage capacitor 29 has completely discharged (see segment 341d) and is at or below ground reference (see time period t3–t4) then the inductive field 23 (see segment 342d) collapses to reach zero at time t4. During time period t2–t3, the opposite polarity inductive field starts to empty the stored charge in trap material 5 (as shown by segment 343c). Between times t3 and t4, the collapse of inductive field 23 forces the electrons in trap material 5 to be attracted to surface 44 (FIG. 4) and trap material 5 becomes empty (see segment 343d) at time t4. During time period t2–t3, the charge in sense capacitor 55 also decays (see segment 344c) in response to the loss of charge in trap material 5, and when the storage capacitor 29 has discharged (at time t4) the sense capacitor 55 will have also discharged (see segment 344d). During this storage process as well, sense capacitor 48 may verify that a discharge occurred, e.g. if the voltage at output trace 198 of sense capacitor 55 falls to a negative threshold Vn at time t4 (e.g. a −3 volt spike).

In one embodiment, input terminal 24 of storage capacitor 29 is grounded (see segment 351c in FIG. 25), and inductive storage capacitor 100 operates as discussed above in reference to FIG. 24, except for a shorter duration than t2–t4. Specifically, the duration is selected to implement one or more partially charged states for inductive storage capacitor 100. For example, to implement two states in addition to the charged and discharged states, input terminal 24 is decoupled from the ground reference (e.g. allowed to float) after the respective durations Tx and Ty, as illustrated by segments 71–72, and therefore storage capacitor 29 remains partially charged as illustrated by segments 73–74. The partially stored charge in inductive storage capacitor 100 is read at durations Tx and Ty that are identical to the corresponding durations used in storing the partial charge, because the device charges and discharges at the same rate due to the resonant frequency. Such multiple states of inductive storage capacitor 100 are used to store multiple bits of data.

Figure 4:
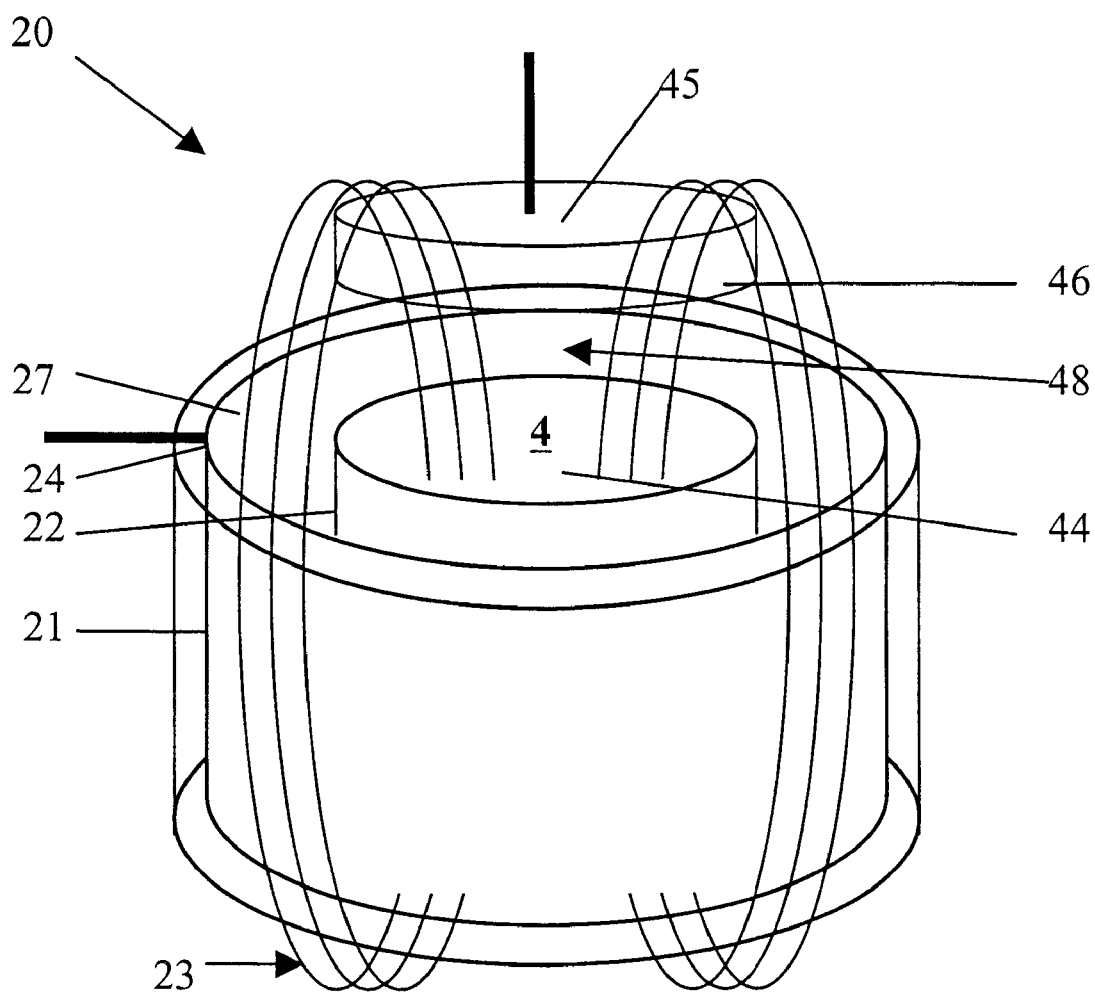
FIG. 4 illustrates physical structure of one embodiment that integrates an inductive capacitor with a sense capacitor, by use of an additional element.

In another embodiment (FIG. 26A) the inductive storage capacitor 360 is constructed on top of a semiconductor wafer instead of inside a via hole. In this example inductive storage capacitor 360 has been created upside down in the same manner as that described above in reference to FIGS. 13–20 except for the following differences. The processing steps are reversed with construction of the inductive storage capacitor 360 starting with a conductive layer 197 that is used to form sense capacitor 48 (FIG. 4). Specifically, conductive layer 197 is deposited using either a metal or polysilicon. Next, a dielectric layer 196 is deposited on conductive layer 197 using a CVD process. Thereafter, plug 195 (e.g. metal) is deposited followed by fourth layer 194 (e.g. silicon nitride ($Si_3N_4$)). The third layer 193 (e.g. silicon dioxide) and second layer 192 (e.g. silicon) are then added. Then first layer 191 (e.g. metal that forms a sleeve or cup) is deposited and connected to the circuit to form inductive storage capacitor 360.

Note that several of the just-described acts can be performed after a thick dielectric is deposited and then a via hole created, e.g. layers 192–195 are deposited in the via hole. Also, a transistor 363 (FIG. 26B) can be built first, followed by formation of inductive storage capacitor 360 as described above. Specifically, drain 367, source 368 and base 369 are initially implanted into a substrate 399, followed by formation of interconnects 364 and 366 on a surface of the substrate 399. Next, a gate oxide 362 is deposited and a gate junction 365 is also deposited, followed by more oxide 362. Thereafter, via 198 is formed in contact with gate junction 365, followed by formation of layers 197–191 as described above.

Figure 29:
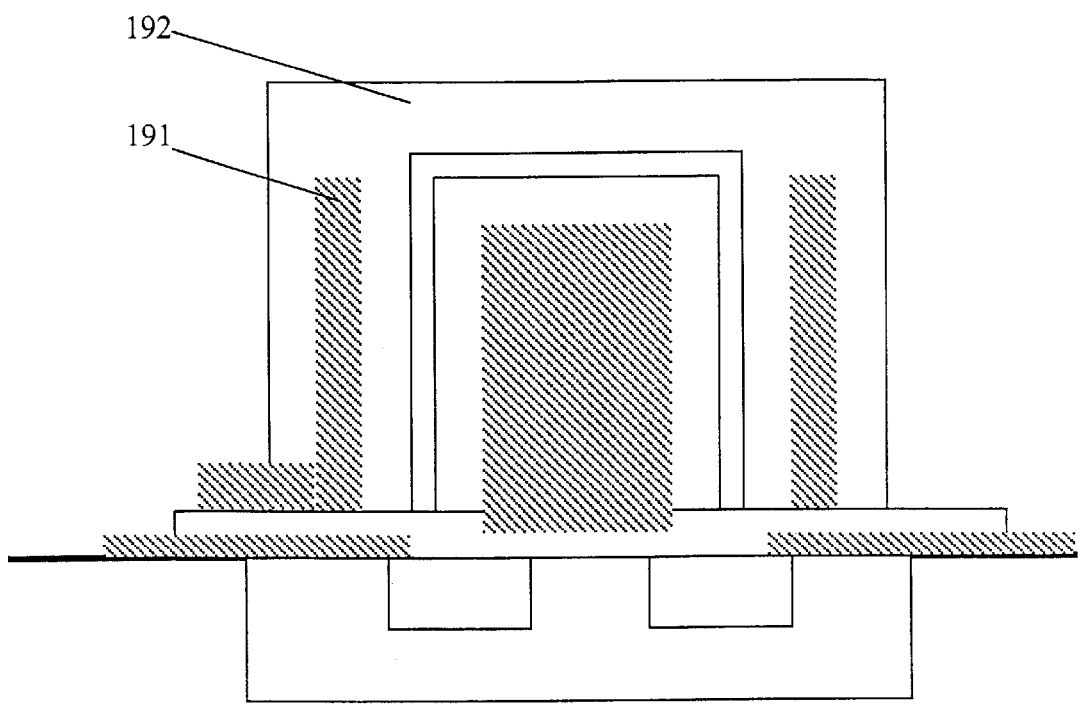

In another embodiment (FIG. 27) the inductive storage capacitor 360 is formed upside down over a transistor (as described above in reference to FIG. 26A), but the transistor's control gate 365 and via 198 are eliminated. The function of gate 365 is performed by conductive layer 197 of sense capacitor 55. In yet another embodiment (FIG. 28) the inductive storage capacitor is formed as described above in reference to FIG. 27, but conductive layer 197 of sense capacitor 55 is eliminated. The function of gate 365 (FIG. 26) is performed by plug 195. In still another embodiment, a roof 290 (FIG. 28) is eliminated (e.g. etched away or not deposited) thereby to form a sleeve 191 instead of a cup (FIG. 29).

Figure 30:
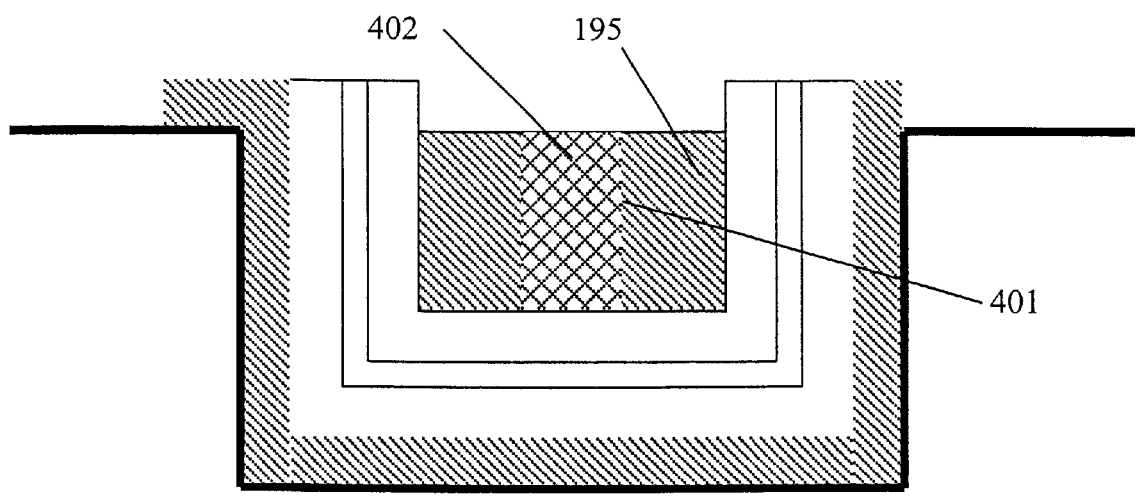
FIG. 30 illustrates a cross section of the inductive storage capacitor with another material deposited into the floating element.

In yet another embodiment, a plug 195 (of any inductive storage capacitor as described herein) is made hollow, e.g. has a hole 401 (FIG. 30) at the center, and a material 402 may be deposited in such a hole 401. Material 402 can be formed in an amorphous (and vitreous, meaning that the atomic structure is ordered only over short distances) form to create free or dangling electron bonds, same as trap material 5. Therefore, material 402 forms an additional storage tunnel (of the type described above in reference to trap material 5). The two storage tunnels in such an inductive storage capacitor act in concert to work better than a single storage tunnel. When two storage tunnels are used, a sense capacitor may be eliminated to prevent a charge in the storage tunnel in the plug from generating a false signal in the sense capacitor.

Note that the just-described additional storage tunnel can replace the storage tunnel at interface 214 (FIG. 12), for example if trap material 5 is not present between sleeve 3 and plug 4 (FIG. 1). In such a case, trap material 5 is replaced with any dielectric material.

In alternative embodiments, material 402 can be any material that is responsive to an inductive field 23. In one implementation, material 402 is a ferroelectric material that has a perovskite crystal structure described by the general chemical formula $ABO_3$, where A and B are large and small cations respectively. Therefore, any material that has paraelectric, pyroelectric, piezoelectric, or ferroelectric property can be embedded in plug 195. Examples of ferroelectric material that can be embedded in plug 195 include $Pb,Zr,TiO_3$ (PZT); $Pb,La,TiO_3$ (PLT); $Pb,La,Zr,TiO_3$ (PLZT); $BaTiO_3$; $Pb,Mg,NbO_3$ (PMN); $Pb,Mg,NbO_3$—$PbTiO_3$ (PMNPT); $SrTiO_3$ to name a few.

A plug 195 that has embedded therein a piezoelectric material may also be used with an inductive storage capacitor that is devoid of trap material 5. In such a case, use of a piezoelectric material in plug 195 has the advantage of being able to control the direction and/or modulation of a beam of light or electrons or electromagnetic energy. Therefore, such a device can be used with a source of light (such as an LED or TFT) built into a semiconductor substrate, e.g. instead of a transistor as described above in reference to FIGS. 26–29.

Figure 31:
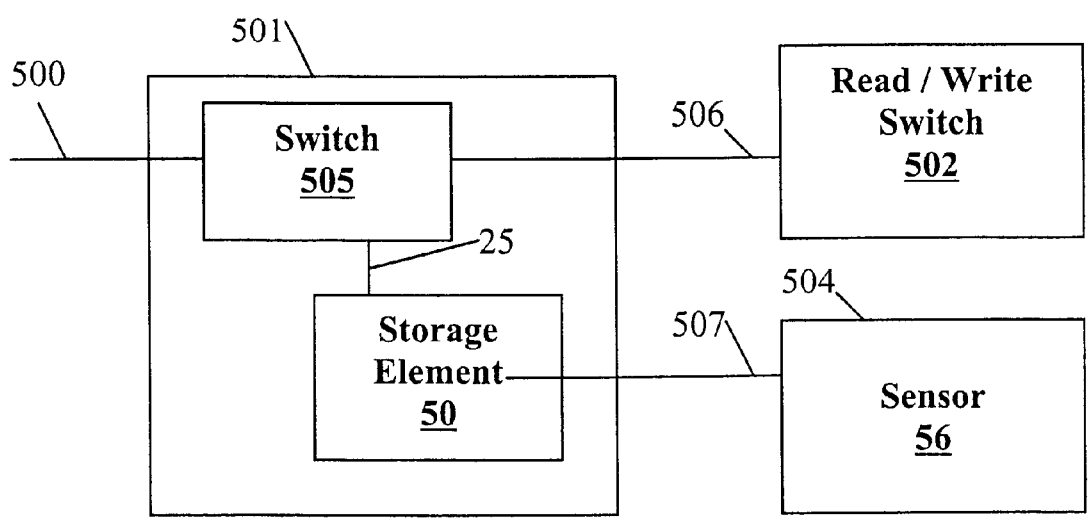
FIG. 31 illustrates, in a block diagram, use of an inductive storage capacitor as a storage element.

In one embodiment, an inductive storage capacitor of the type described herein is used as a storage element 50 (FIG. 31) in a memory cell 501 that may include a switch 505 coupled to storage element 50 by a conductive trace 25. Switch 505, when operated by a control signal on a line 506, couples a trace 500 (that carries a signal of voltage Vmax) to an input terminal of storage element 50 (via trace 25). Memory cell 501 may be operated by a read/write switch 502 that provides the control signal on line 506. Memory cell 501 is coupled by an output trace 507 to a sensor 56 (as described above in reference to FIG. 5).

Figure 32:
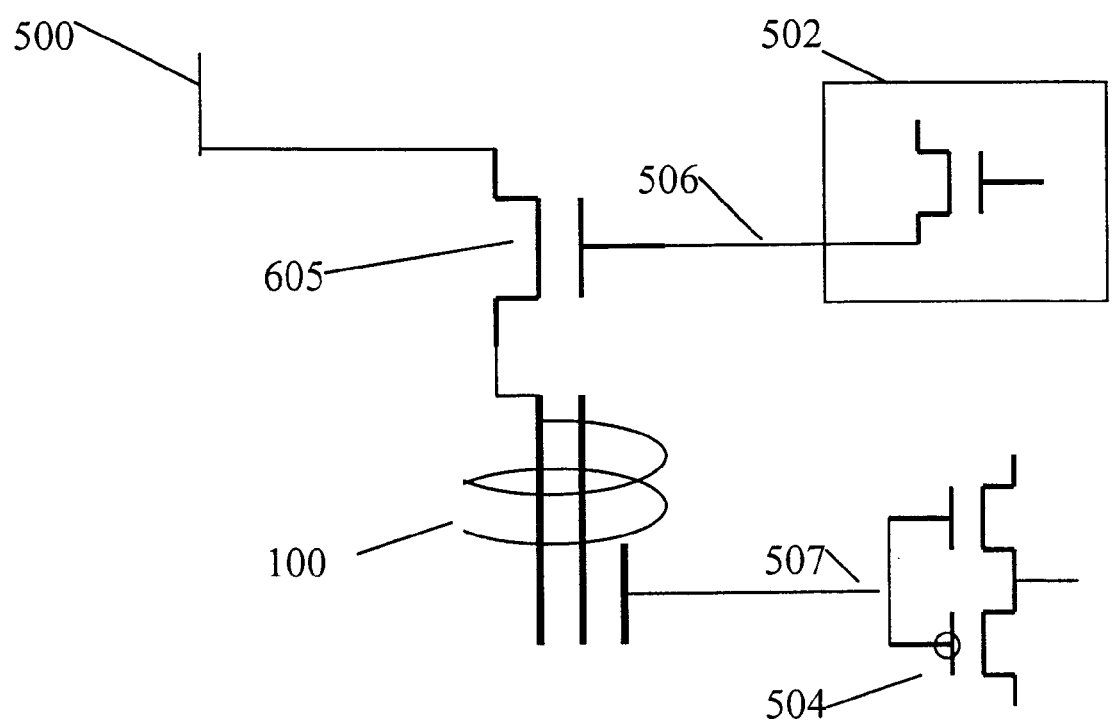
FIG. 32 illustrates, in a circuit diagram, circuit elements that realize the embodiment of FIG. 31.

In one implementation, switch 505 is implemented by an NMOS transistor 605 (FIG. 32) having a gate connected to trace 506 (that is connected to read/write switch 502 as discussed above), and storage element 50 is implemented by inductive storage capacitor 100. Transistor 605 is turned on during the read cycle, and the output of the inductive storage capacitor 100 is read by the sensor 56 (that is implemented by a CMOS transistor 604).

In one embodiment, the following signals (wherein 1 represents a charged state and 0 represents a discharged state) are present at the input/output terminals of memory cell 501.

| | Input line 500 | Read/Write line 506 | Memory Cell state | Memory Cell output 507 |
|---|---|---|---|---|
| Read 0 | 1 | 1 | Discharged | 0 |
| Read 1 | 1 | 1 | Charged | 1 |
| Write 0 | 0 | 1 | Discharged | −1 |
| Write 1 | float | 0 | Charged | 0 |

Specifically, in a read operation, input line 500 and read/write line 506 both carry a high signal, and a stored charge (either 0 or 1) is supplied on output line 507. Note that at the end of each read operation, memory cell 501 has been charged. In an operation to write a 0, input line 500 carries 0 and read/write line 506 carries a high signal, and memory cell 501 is discharged to a voltage of zero. In an operation to write a 1, input line 500 floats and read/write line 506 carries a low signal, and memory cell 501 stays charged.

Figure 33:
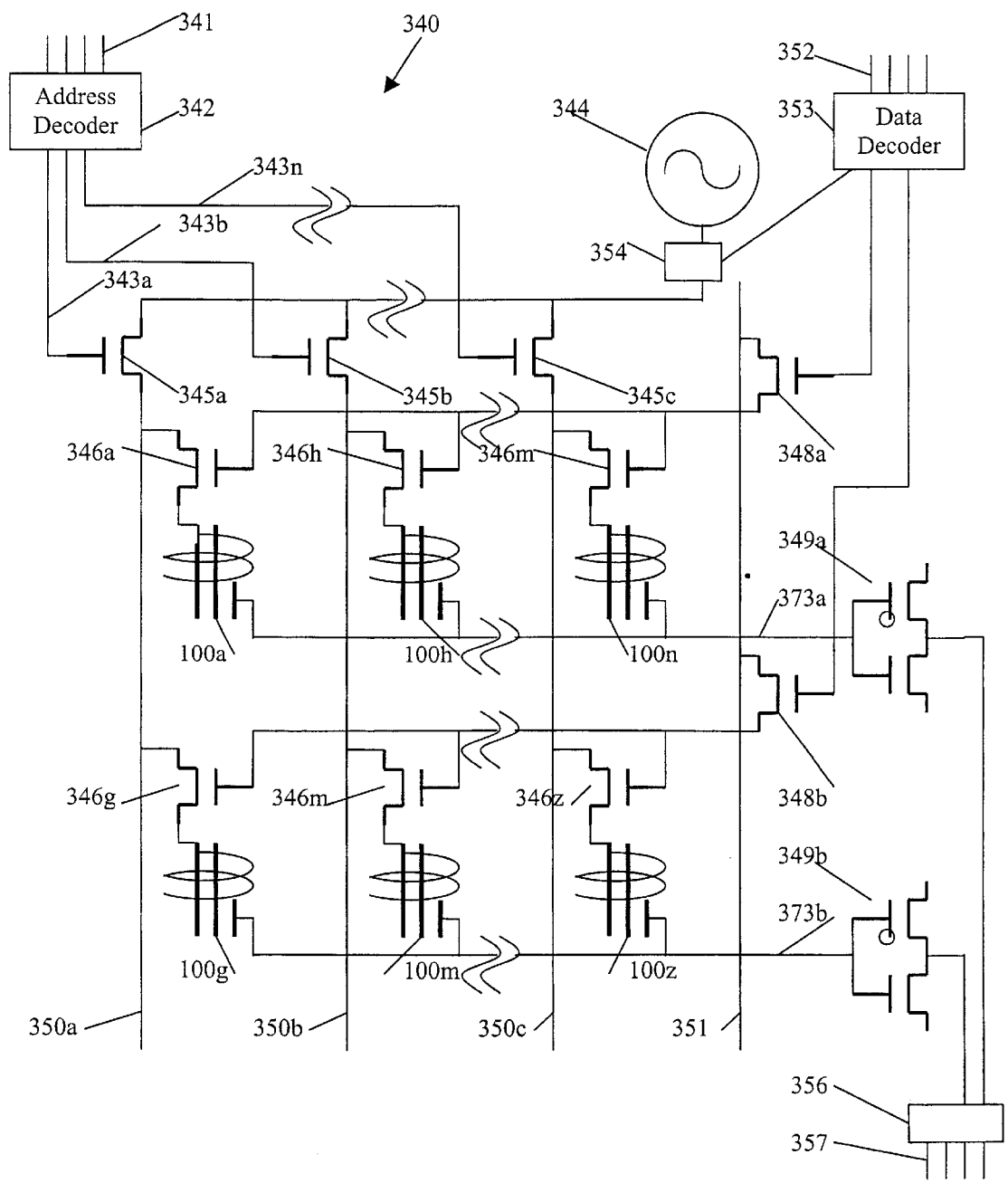
FIG. 33 illustrates a memory cell array formed of inductive storage capacitors.

In one embodiment, a memory array 340 (FIG. 33) uses a number of inductive storage capacitors (of the type described herein), each coupled to receive a signal of voltage Vmax from a respective transistor, thereby to form a two-dimensional array of memory cells 100a–100z. An address bus 341 (e.g. coupled to a CPU) provides input signals for an address decoder 342. In response to the input signals, address decoder 342 selects one of several select lines 343a through 343n to access a row 350a of memory cells 100a through 100g located in the array. An active signal on select line 343a from decoder 342, causes voltage source 344 to provide signals to timing control circuit 354 that in turn supplies a signal to transistor 345a.

Transistor 345a passes the signal from timing control circuit 354, through a line 350a, to each of memory cells 100a–100g. Transistors 346a–346g in the respective memory cells 100a–100g have their gates coupled via their respective transistors 348a–348g to a data decoder 353. Data decoder 353 receives a control signal (e.g. from timing control circuit 354) to turn on transistors 346a–346g during a read operation. When turned on, transistors 346a–346g pass the signal of voltage Vmax from voltage source 344 to their respective inductive storage capacitors (not labeled). In response, inductive storage capacitors provide their stored charges to output lines 373a–373g that are coupled to the respective sensors 349a–349g. Sensors 349a–349g are coupled to a latch 356, that in turn provides the latched signals to an output data bus 357.

During a write operation, address decoder 342 operates in the same manner as that discussed above for the read operation. The data to be stored is received on an input data bus 352, and is decoded in data decoder 353. Data decoder 353 operates transistors 348a–348g to drive appropriate signals to the respective inductive storage capacitors, to write a zero (or discharged state) or one (or charged state). When a zero (or 1) is set then the column transistor 348a–348g is turned on (or off) to allow the voltage source 344 to discharge (or stay charged) memory cells 100a–100g.

To generate signals for transistors 348a–348g, data decoder 353 inverts the data received on data input bus 352, because a previous read operation has left memory cells 100a–100g in a charged state, and data decoder 353 must determine which cells must be discharged (to reflect the data received on bus 352). As a read operation always precedes a write operation, decoder 353 must invert the data signal.

Furthermore, as a read operation results in charged state of the memory cells 100a–100g, all data stored in these cells is no longer left therein, thereby resulting in a destructive read. Therefore, latch 356 may be coupled to transistors 346a–346g which pass the signal of voltage Vmax from voltage source 344 to their respective inductive storage capacitors (not labeled), so that the just-read data is rewritten (at the end of a read operation) into memory cells 100a–100g. Note that any addressing circuitry that operates with destructive read memory cells can be used, e.g. see U.S. Pat. No. 4,153,934 that is incorporated by reference herein in its entirety.

Numerous modifications and adaptations of the embodiments, implementations and examples described herein will be apparent to the skilled artisan in view of the disclosure. For example, an inductive capacitor of the type described herein, but devoid of the trap material, is used in one embodiment of a radio-frequency circuit (such as an RF detector) as an LC filter. Such an LC filter has the advantage of eliminating the need for an external filter, and takes less real estate on the die than a conventional LC filter in which the inductor is formed separate and distinct from the capacitor. Furthermore, although in some embodiments, certain surfaces are flat, or cylindrical, or parallel, or coaxial to one another, in other embodiments, other surfaces may just approximate such surfaces to within 10% variation in a measure of the respective properties (such as two surfaces with 10% variation in distance therebetween are considered approximately parallel, and a surface is considered approximately cylindrical if it fits within two concentric cylinders with the smaller cylinder having 90% of the volume of the larger cylinder), depending on manufacturing constraints.

Numerous such modifications and adaptations are encompassed by the attached claims.

What is claimed is:

1. A device comprising:
   a first element of conductive material (hereinafter "first conductive element");
   a second element of conductive material (hereinafter "second conductive element") at least partially surrounding the first conductive element and physically separated from the first conductive element;
   a third element physically separated from each of the first conductive element and the second conductive element, the third element being located transverse to each of a first axis of the first conductive element and a second axis of the second conductive element; and
   an interface having a plurality of dangling bonds, said interface being located between said first conductive element and said second conductive element, said interface being formed between two dielectric materials, said two dielectric materials being located between said first conductive element and said second conductive element, said two dielectric materials being at least partially surrounded by the second conductive element.

2. The device of claim 1 further comprising:
   a semiconductor substrate;
   wherein each of the first conductive element, the second conductive element and the two dielectric materials are supported by the semiconductor substrate.

3. The device of claim 1 wherein the second conductive element surrounds a majority of a surface of the first conductive element.

4. The device of claim 1 wherein the first conductive element is at least approximately cylindrical in shape.

5. The device of claim 1 wherein the first conductive element and the third conductive element form a capacitor.

6. The device of claim 1 wherein to first conductive element has a first end facing the third element, the first end being at least approximately flat.

7. The device of claim 6 wherein the third element has a surface at least approximately parallel to the first end.

8. The device of claim 1 wherein the third element comprises an electrical conductive material.

9. The device of claim 1 wherein the second conductive element includes one electrical conductive material and the third element includes another electrical conductive material.

10. The device of claim 1 wherein an electrical charge can be sensed in the third element.

11. The device of claim 1 wherein the first conductive element and the second conductive element form a capacitor.

12. The device of claim 1 wherein the first conductive element and the second conductive element form a first capacitor and the first conductive element and the third element form a sense capacitor, wherein the third element is conductive and the first capacitor and the sense capacitor are coupled in series.

13. The device of claim 1 wherein the first conductive element and the second conductive element form an inductor, wit the first conductive element acting as a core and the second conductive element acting as a coil.

14. The device of claim 1 wherein the first conductive element generates an electrical charge in response to applying power to the second conductive element.

15. The device of claim 1 wherein:

the first conductive element is cylindrical in shape with at least one flat end;

a material between the first conductive element and the second conductive element is at least substantially dielectric;

the third element is at least substantially parallel to the flat end of the first conductive element; and another material between the first conductive element and the third element is at least substantially dielectric.

16. A device comprising:

a first element of conductive material (hereinafter "first conductive element");

a second element of conductive material (hereinafter "second conductive element") at least partially surrounding the first conductive element and physically separated from the first conductive element;

two dielectric materials being located between said first conductive element and said second conductive element, said two dielectric materials being at least partially surrounded by the second conductive element; and a third conductive element physically separated from each of the first conductive element and the second conductive element, the third element being located transverse to each of a first axis of the first conductive element and a second axis of the second conductive element.

17. The device of claim 16 wherein:

the first conductive element is cylindrical in shape with at least one flat end; and the third element is at least substantially parallel to the flat end of the first conductive element.

18. The device of claim 16 wherein the first conductive element and the second conductive element form an inductor, with the first conductive element acting as a core and the second conductive element acting as a coil.

* * * * *